(12) United States Patent
Cheng et al.

(10) Patent No.: US 11,011,610 B2
(45) Date of Patent: May 18, 2021

(54) PLATE DESIGN TO DECREASE NOISE IN SEMICONDUCTOR DEVICES

(71) Applicant: Taiwan Semiconductor Manufacturing Co., Ltd., Hsin-Chu (TW)

(72) Inventors: Chih-Chang Cheng, Hsinchu (TW); Fu-Yu Chu, Hsinchu (TW); Ming-Ta Lei, Hsin-Chu (TW); Ruey-Hsin Liu, Hsin-Chu (TW); Shih-Fen Huang, Jhubei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/837,444

(22) Filed: Apr. 1, 2020

(65) Prior Publication Data
US 2020/0227529 A1 Jul. 16, 2020

Related U.S. Application Data

(62) Division of application No. 15/800,474, filed on Nov. 1, 2017, now Pat. No. 10,658,482.

(51) Int. Cl.
*H01L 29/78* (2006.01)
*H01L 29/423* (2006.01)
(Continued)

(52) U.S. Cl.
CPC .... *H01L 29/4238* (2013.01); *H01L 21/26513* (2013.01); *H01L 21/28123* (2013.01);
(Continued)

(58) Field of Classification Search
CPC ............. H01L 29/4238; H01L 29/0653; H01L 29/0847; H01L 29/78; H01L 29/4916; H01L 21/26513; H01L 21/28123
See application file for complete search history.

(56) References Cited

U.S. PATENT DOCUMENTS 8,716,768 B2 5/2014 Lyu et al.
9,190,536 B1 11/2015 Chan et al.
(Continued)

OTHER PUBLICATIONS

Kwon, et al. "Effects of Shallow Trench Isolation on Low Frequency Noise Characteristics of Source-Follower Transistors in CMOS Image Sensors." Solid-State Electronics 119 (2016) 29-32, published Mar. 1, 2016.
(Continued)

*Primary Examiner* — Timor Karimy
(74) *Attorney, Agent, or Firm* — Eschweiler & Potashnik, LLC

(57) ABSTRACT

A semiconductor device and method for forming the semiconductor device are provided. In some embodiments, a semiconductor substrate comprises a device region. An isolation structure extends laterally in a closed path to demarcate the device region. A first source/drain region and a second source/drain region are in the device region and laterally spaced. A sidewall of the first source/drain region directly contacts the isolation structure at a first isolation structure sidewall, and remaining sidewalls of the first source/drain region are spaced from the isolation structure. A selectively-conductive channel is in the device region, and extends laterally from the first source/drain region to the second source/drain region. A plate comprises a central portion and a first peripheral portion. The central portion overlies the selectively-conductive channel, and the first peripheral portion protrudes from the central portion towards the first isolation structure sidewall.

20 Claims, 24 Drawing Sheets

(51) Int. Cl.
*H01L 21/265* (2006.01)
*H01L 21/28* (2006.01)
*H01L 29/06* (2006.01)
*H01L 29/08* (2006.01)
*H01L 29/49* (2006.01)

(52) U.S. Cl.
CPC ...... *H01L 29/0653* (2013.01); *H01L 29/0847* (2013.01); *H01L 29/78* (2013.01); *H01L 29/4916* (2013.01)

(56) References Cited

U.S. PATENT DOCUMENTS

| | | |
|---|---|---|
| 10,164,033 B2 | 12/2018 | Yeo et al. |
| 2006/0192258 A1 | 8/2006 | Tsuchiya et al. |
| 2009/0224335 A1 | 9/2009 | Chang |
| 2010/0315115 A1 | 12/2010 | Lee et al. |
| 2012/0074498 A1 | 3/2012 | Chuang |
| 2013/0154023 A1 | 6/2013 | Yoshida et al. |
| 2013/0334614 A1 | 12/2013 | Liaw |
| 2014/0042506 A1 | 2/2014 | Ramberg et al. |
| 2015/0200249 A1 | 7/2015 | Kundu |
| 2017/0235795 A1 | 8/2017 | Gilder |
| 2017/0294356 A1 | 10/2017 | Yeh et al. |
| 2019/0088780 A1 | 3/2019 | Choi et al. |

OTHER PUBLICATIONS

Chan, et al. "STI Effect on Flicker Noise in 0.13-μm RF NMOS." Proceeding of the 36th European IEEE Solid-State Device Research Conference, 2006. ESSDERC 2006. Published Feb. 12, 2007.
U.S. Appl. No. 15/257,291, filed Sep. 6, 2016.
U.S. Appl. No. 15/688,018, filed Aug. 28, 2017.
Non-Final Office Action dated Jun. 2, 2017 for U.S. Appl. No. 15/257,291.
Notice of Allowance dated Nov. 3, 2017 for U.S. Appl. No. 15/257,291.
Non-Final Office Action dated Jul. 10, 2018 for U.S. Appl. No. 15/688,018.
Final Office Action dated Jan. 30, 2019 for U.S. Appl. No. 15/688,018.
Carmonai, M, Hubert, L. Lopezi, F. Julieni, J., Ogieri, D. Goguenheim, and L. Beauvisagei Study of gate contact over active area, 2014 29th Symposium on Microelectronics Technology and Devices (SBMicro), Aracaju, 2014, pp. 1-4. (Year: 2014).
U.S. Appl. No. 16/363,114, filed Mar. 25, 2019.
Non-Final Office Action dated Aug. 20, 2019 in connection with U.S. Appl. No. 15/688,018.
Notice of Allowance dated Feb. 13, 2020 in connection with U.S. Appl. No. 15/688,018.
Non-Final Office Action dated Oct. 24, 2019 for U.S. Appl. No. 15/800,474.
Notice of Allowance dated Jan. 15, 2020 for U.S. Appl. No. 15/800,474.

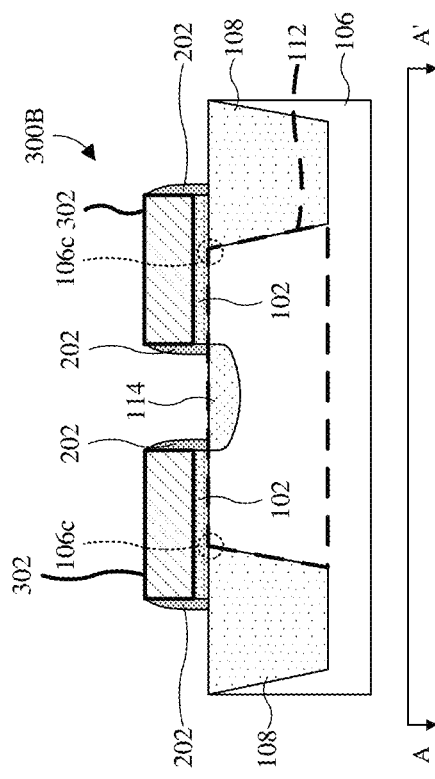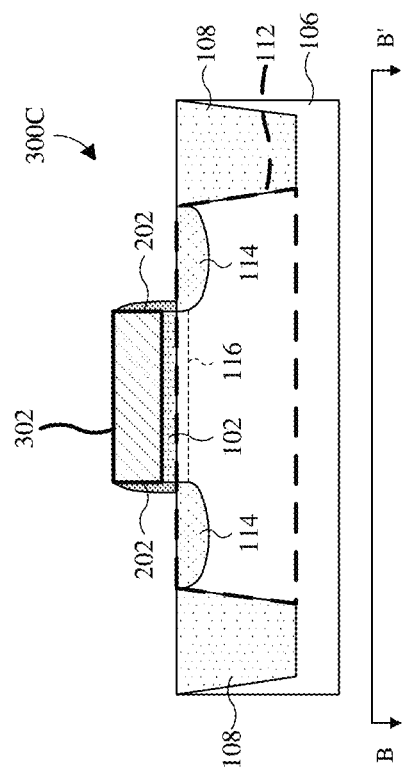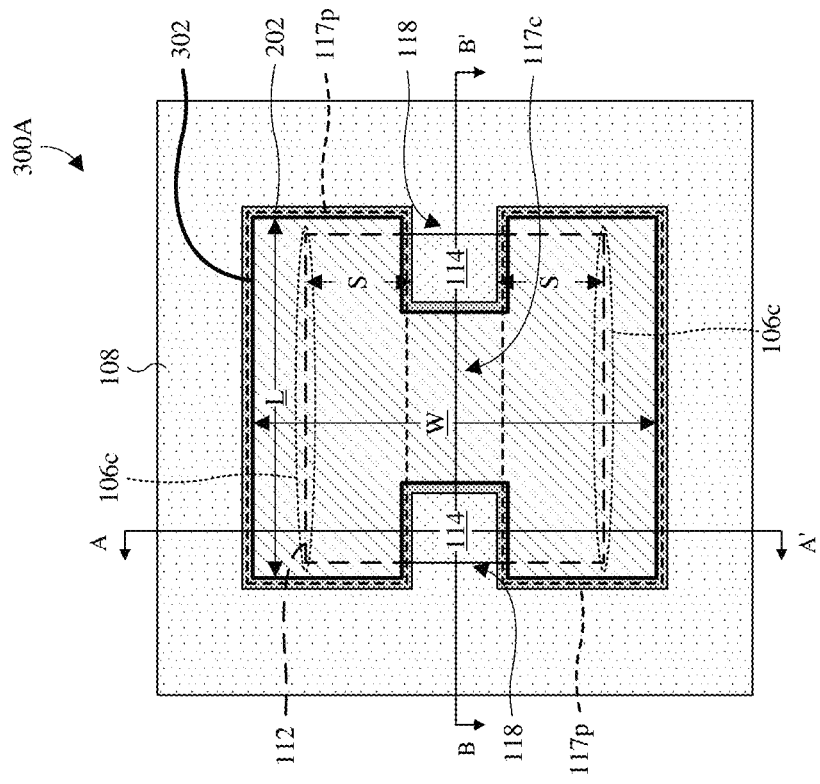
Fig. 3B
Fig. 3C
Fig. 3A

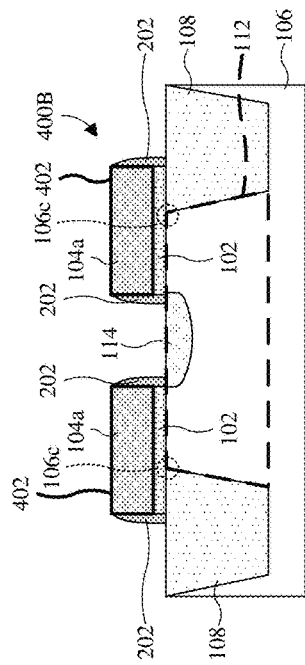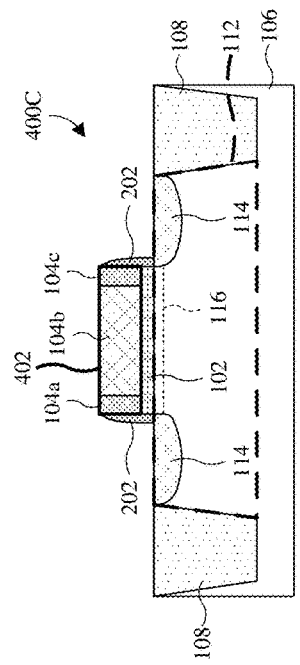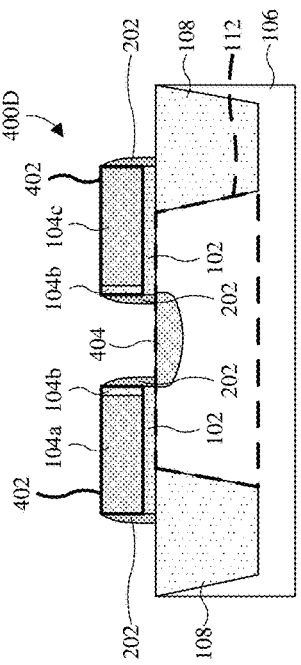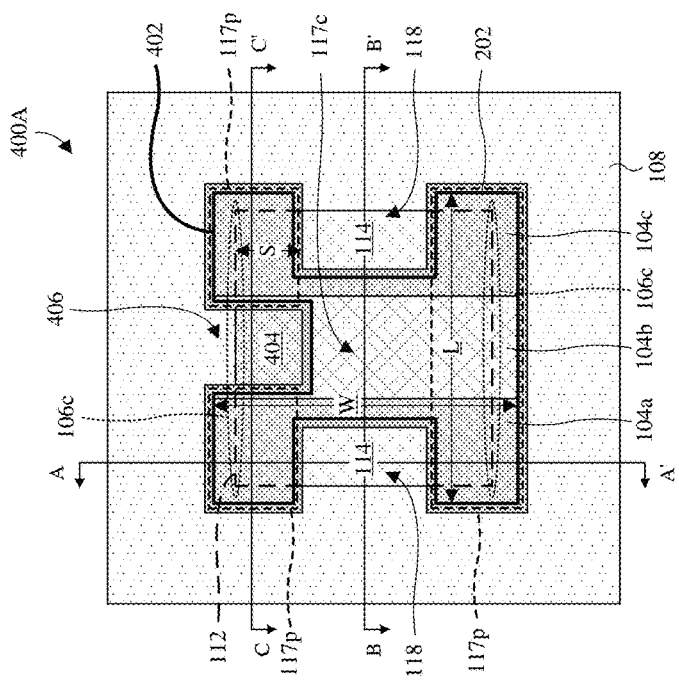

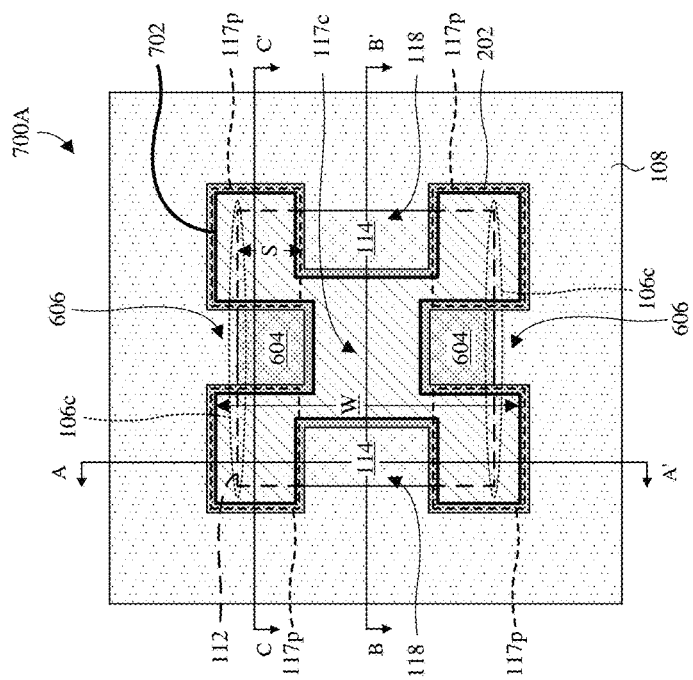
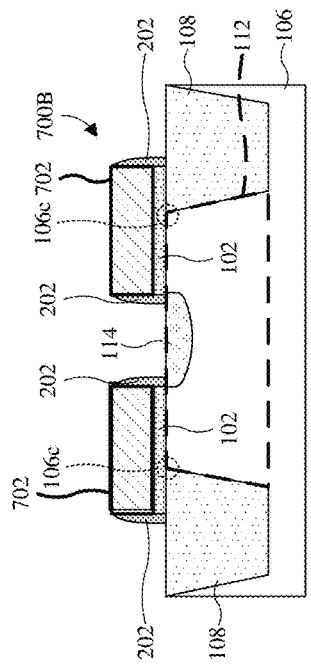
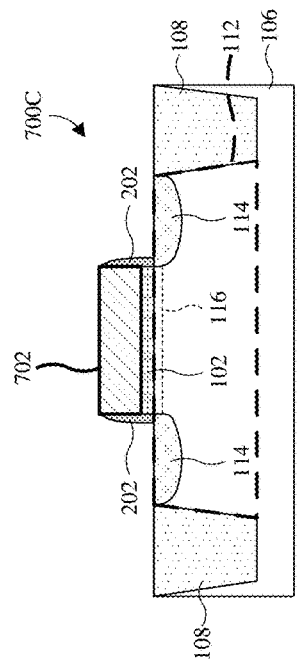
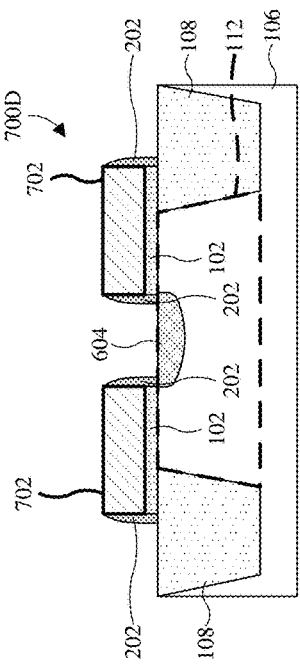

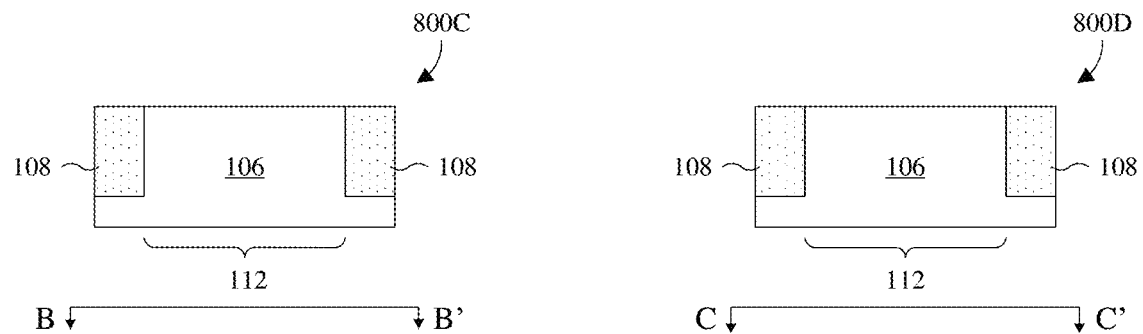
Fig. 8C     Fig. 8D
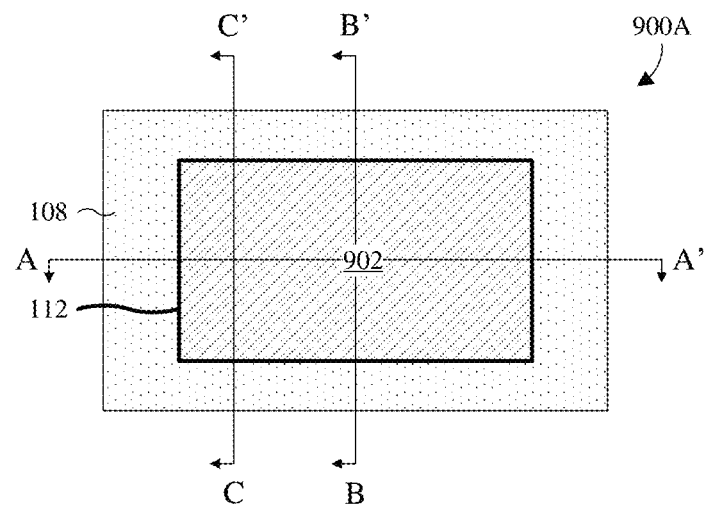
Fig. 9A

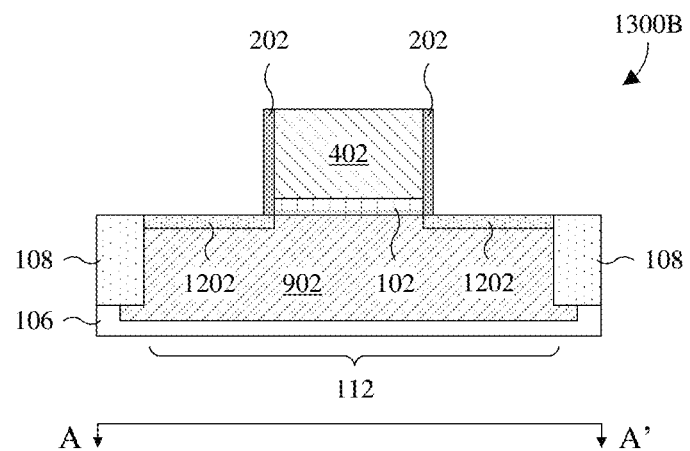
Fig. 13B
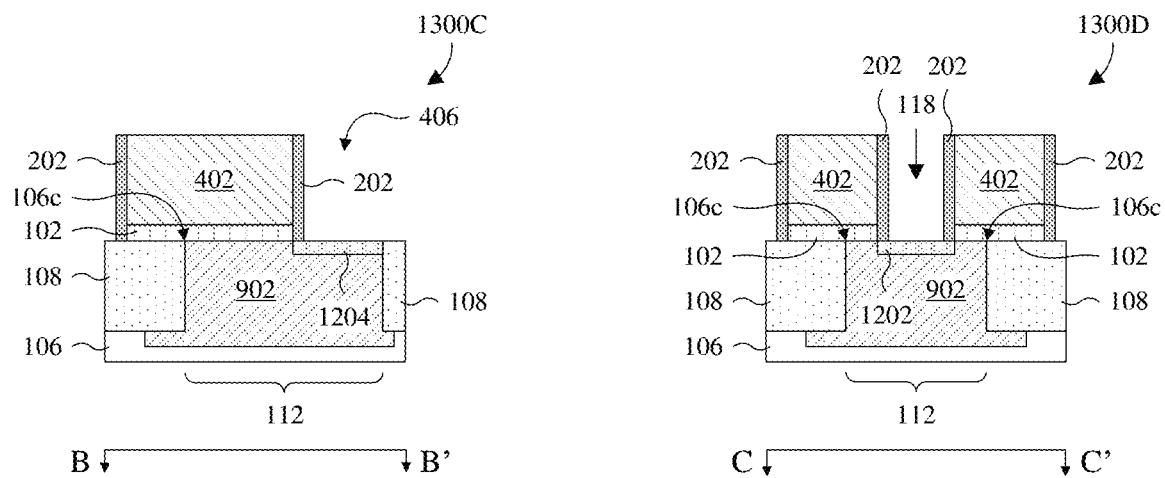
Fig. 13C
Fig. 13D

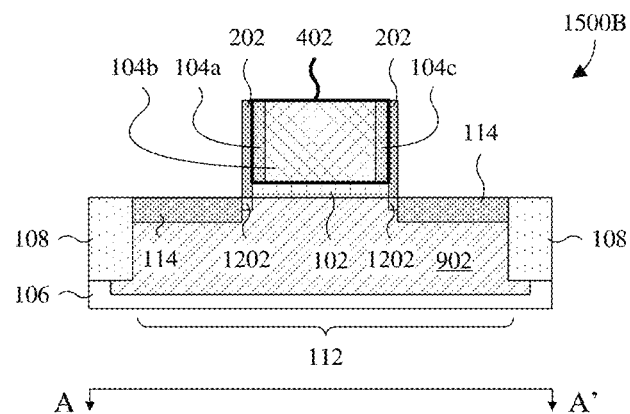
Fig. 15B
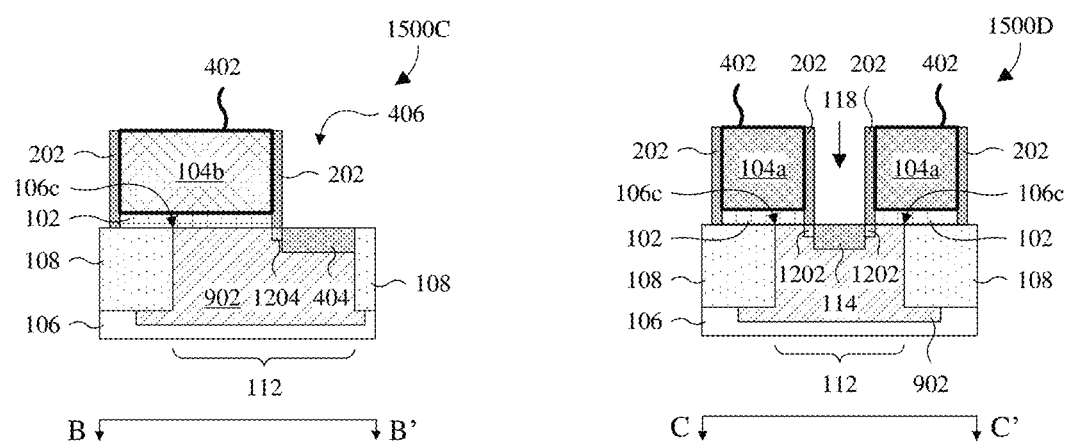
Fig. 15C
Fig. 15D

PLATE DESIGN TO DECREASE NOISE IN SEMICONDUCTOR DEVICES

REFERENCE TO RELATED APPLICATION

This application is a Divisional of U.S. application Ser. No. 15/800,474, filed on Nov. 1, 2017, the contents of which are hereby incorporated by reference in their entirety.

BACKGROUND

Semiconductor devices are electronic components that exploit electronic properties of semiconductor materials to affect electrons or their associated fields. A widely used type of semiconductor device is a field-effect transistor (FET). A FET comprises a pair of source/drain regions, a selectively-conductive channel, and a gate electrode. FETs are versatile devices that may be used for, among other things, switches, amplifiers, and memory. Examples of FETs include metal-oxide-semiconductor field-effect transistors (MOSFETs) and junction gate field-effect transistors (JFETs).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-2C and 3A-3C illustrate various views of various more detailed embodiments of the FET of FIGS. 1A-1C in which the FET is a metal-oxide-semiconductor FET (MOSFET).

FIGS. 4A-4D through 7A-7D illustrate various views of various more detailed embodiments of the FET of FIGS. 1A-1C in which the FET is a junction gate FET (JFET).

FIGS. 8A-8D through 17A-17D illustrate a series of views of some embodiments of a method for forming a FET with low flicker and random telegraph noise.

DETAILED DESCRIPTION

Figure 1A:
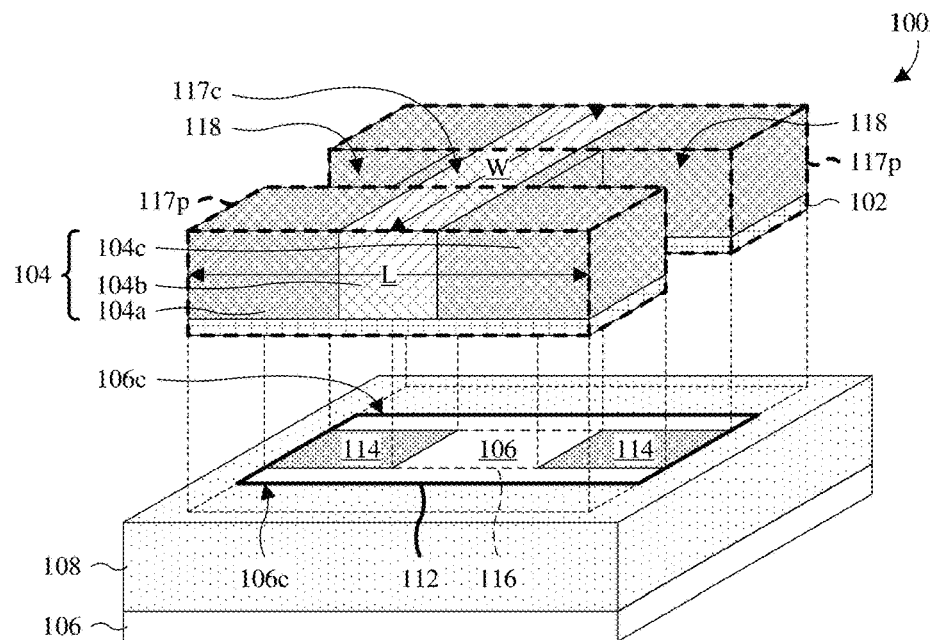
FIGS. 1A-1D illustrate various perspective views of some embodiments of a field-effect transistor (FET) with low flicker and random telegraph noise.

The present disclosure will now be described with reference to the drawings wherein like reference numerals are used to refer to like elements throughout, and wherein the illustrated structures are not necessarily drawn to scale. It will be appreciated that this detailed description and the corresponding figures do not limit the scope of the present disclosure in any way, and that the detailed description and figures merely provide a few examples to illustrate some ways in which the inventive concepts can manifest themselves.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some field-effect transistors (FETs) comprise a semiconductor substrate and a shallow trench isolation (STI) structure. The STI structure is over and sunken into the semiconductor substrate to demarcate a device region of the semiconductor substrate. Further, the FET comprises a pair of source/drain regions, a selectively-conductive channel, a gate dielectric layer, and a gate electrode. The source/drain regions are laterally spaced, and are over and recessed into the device region of the semiconductor substrate. The selectively-conductive channel is in the device region of the semiconductor substrate and extends from one of the source/drain regions to another one of the source/drain regions. The gate dielectric layer overlies the selectively-conductive channel, and the gate electrode overlies the gate dielectric layer.

A challenge with the above FETs is flicker noise and random telegraph noise (RTN). One source of flicker and random telegraph noise is defect states at an interface between the gate dielectric layer and the device region of the semiconductor substrate. As current flows through the selectively-conductive channel, carriers are trapped and de-trapped by the defect states, thereby generating the flicker and random telegraph noise. The trapping and de-trapping occurs at a central portion of the selectively-conductive channel that interfaces with the gate dielectric layer. Further, the trapping and de-trapping occurs at a pair of STI corners at peripheral portions of the selectively-conductive channel. The STI corners are top cross-sectional corners of the semiconductor substrate that interface with the gate dielectric layer and the STI structure in the device region of the semiconductor substrate. Further, the STI corners are respectively on opposite sides of the selectively-conductive channel, and each extends laterally along a length of the selectively-conductive channel from one of the source/drain regions to another one of the source/drain regions. The STI corners have a high amount of defect states because the STI corners have high mechanical stress and are not defined by perfectly planar surfaces. Further, electric fields are strong at the STI corners because the STI corners have small radiuses of curvature. This, in turn, leads to high trapping and high de-trapping at the STI corners.

A partial solution to the challenge is to move the source/drain regions from the STI corners using a photoresist mask. For example, a photoresist mask may be formed on the device region of the semiconductor with a pair of source/drain openings that overlap the device region and that are spaced from the STI corners. Ion implantation may then be performed into the device region of semiconductor substrate, through the photoresist mask, to form the source/drain regions spaced from the STI corners. By spacing the source/drain regions from the STI corners, current flow along the STI corners is reduced, thereby reducing flicker and random telegraph noise generated at the STI corners. However, the partial solution does not address flicker and random telegraph noise generated by current flow along the central portion of the selectively-conductive channel. Further, using the photoresist mask to move the source/drain regions leads to poor performance uniformity during bulk manufacture, and leads to challenges during silicide formation. For example, it may be challenging to prevent silicide from forming on the device region, directly between the source/drains and the STI corners.

In view of the foregoing, various embodiments of the present application are directed toward a FET comprising a plate design that reduces noise, as well as method for forming the FET. In some embodiments, the FET comprises a semiconductor substrate, an isolation structure, a first source/drain region, a second source/drain region, a selectively-conductive channel, and a plate. The semiconductor substrate comprises a device region. The isolation structure extends laterally in a closed path to demarcate the device region. The first source/drain region and the second source/drain region are in the device region and are laterally spaced. A sidewall of the first source/drain region directly contacts the isolation structure at a first isolation structure sidewall, and remaining sidewalls of the first source/drain region are spaced from the isolation structure. A sidewall of the second source/drain region directly contacts the isolation structure at a second isolation structure sidewall, and remaining sidewalls of the second source/drain region are spaced from the isolation structure. The selectively-conductive channel is in the device region, and extends laterally from the first source/drain region to the second source/drain region. The plate comprises a central portion and a first peripheral portion. The central portion overlies the selectively-conductive channel, and the first peripheral portion protrudes from the central portion towards the first isolation structure sidewall.

During formation of the FET, ion implantation may be performed into the semiconductor substrate with the plate in place, such that the plate serves as a mask and the source/drain regions are self-aligned to the plate. Therefore, the planar top layout of the plate facilitates formation of the source/drain regions with the remaining sidewalls spaced from the isolation structure. As a result of the spacing, the source/drain regions are spaced from defect states at STI corners extending from the first isolation structure sidewall to the second isolation structure sidewall. This reduces source-drain current floating along the STI corners, which reduces carriers becoming trapped and de-trapped by defects states at the STI corners. Accordingly, flicker and random telegraph noise is reduced.

In some embodiments, the plate further comprises doped regions varying the work function of the plate, thereby pushing source-drain current deeper into the device region of the semiconductor substrate. Accordingly, less current flows along the top surface of the device region of the semiconductor substrate, thereby reducing charge carriers becoming trapped and de-trapped by defect states at a top surface. This, in turn, reduces flicker and random telegraph noise generated by the defect states.

Figure 1B:
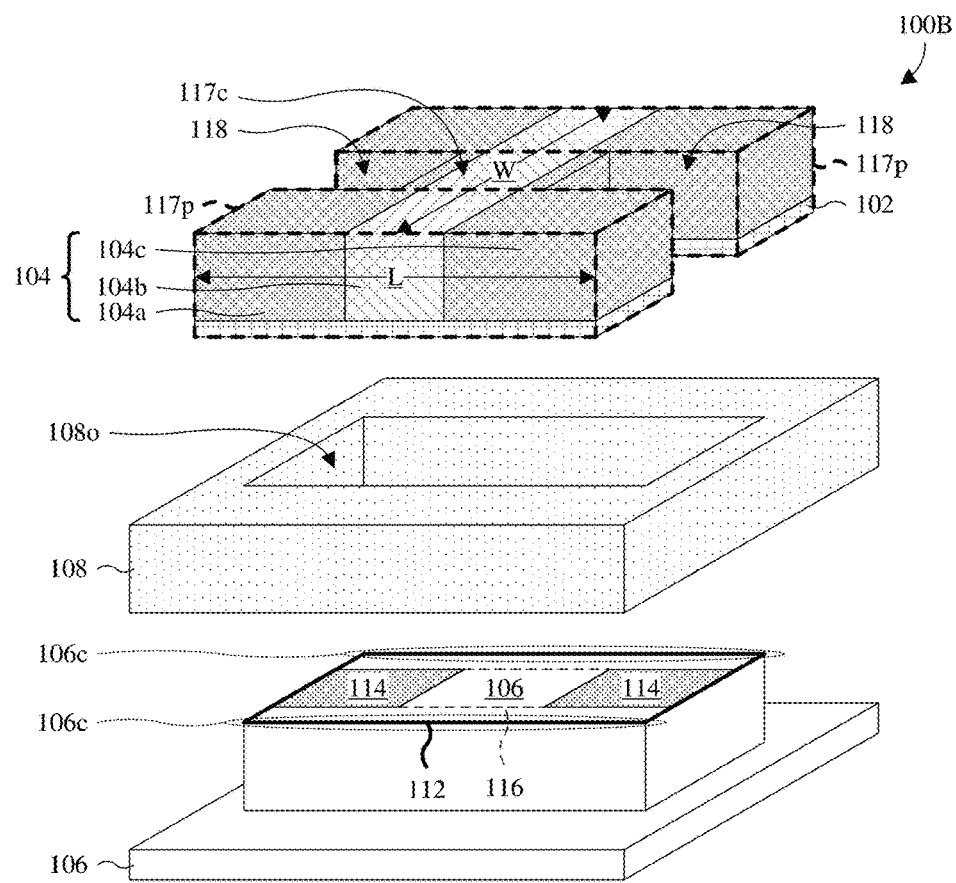
Figure 1C:
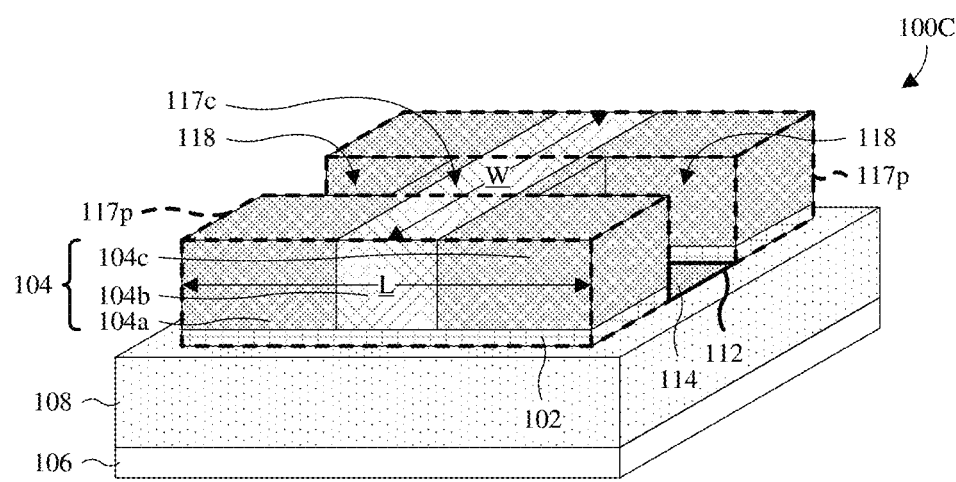
Figure 1D:
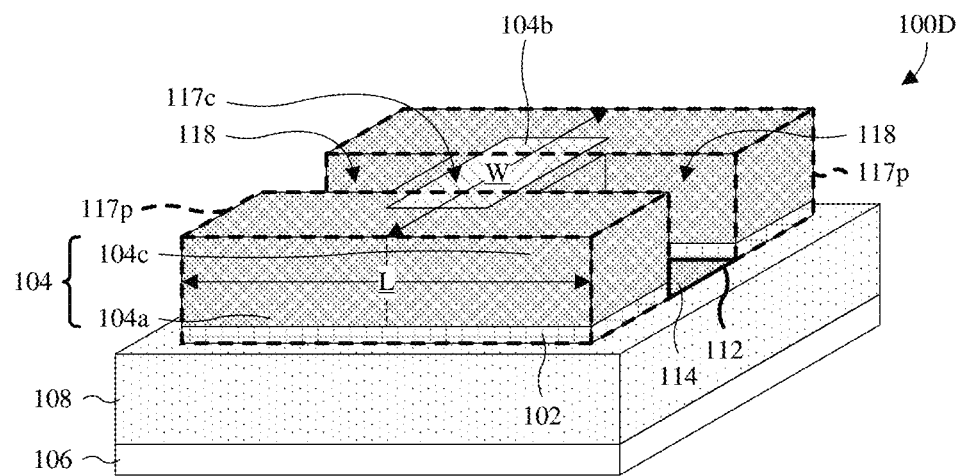

With reference to FIGS. 1A-1D, various perspective views 100A-100C of some embodiments of a FET with low flicker and random telegraph noise is provided. FIG. 1A is a deconstructed perspective view 100A of the FET, FIG. 1B is another deconstructed perspective view 100B of the FET, FIG. 1C is a constructed perspective view 100C of the FET, and FIG. 1D is a constructed perspective view 110D of an alternative embodiment of the FET. FIG. 1A is "deconstructed" in that a plate dielectric layer 102 (also called a gate dielectric layer in MOSFETs) and a plate 104 (also called a gate in MOSFETs) are separated from a semiconductor substrate 106 and an isolation structure 108 on which the plate dielectric layer 102 and the plate 104 normally rest. FIG. 1B is "deconstructed" in the same manner as FIG. 1A, except the isolation structure 108 is further separated from the semiconductor substrate 106 on which the isolation structure 108 normally rests. The FET may be, for example, a metal-oxide-semiconductor field-effect transistor (MOSFET) or a junction gate field-effect transistor (JFET).

As illustrated, the isolation structure 108 is over and extends into the semiconductor substrate 106 to delineate a device region 112 of the semiconductor substrate 106. In some embodiments, the isolation structure 108 has a generally ring-shaped layout, and/or defines a device-region opening 108o (see FIG. 1B) filled by the device region 112. A "generally" ring-shaped layout is similar to a ring-shaped layout, except it is not limited to circular inner and outer sidewalls. For example, a generally ring-shaped layout may be a square ring-shaped layout. The isolation structure 108 may be, for example, a STI region or a deep trench isolation (DTI) region. The semiconductor substrate 106 may be, for example, a bulk semiconductor substrate, such as a bulk silicon substrate of monocrystalline silicon.

A pair of source/drain regions 114 is over and in the device region 112, and the source/drain regions 114 are laterally spaced. Further, the source/drain regions 114 are respectively on a first end of the device region 112 and a second end of the device region 112 opposite the first end. A selectively-conductive channel 116 is defined by a bulk of the device region 112, laterally between the source/drain regions 114. Further, the selectively-conductive channel 116 extends from one of the source/drain regions 114 to another one of the source/drain regions 114, along a top surface of the device region 112. In some embodiments where the FET is a MOSFET, the source/drain regions 114 and the bulk of the device region 112 are doped regions of the semiconductor substrate 106 having opposite doping types. For example, the device region 112 may be p-type and the source/drain regions 114 may be n-type, or vice versa. In some embodiments where the FET is a JFET, the source/drain regions 114 have the same doping type as the bulk of the device region 112, and further have a higher doping concentration than the bulk of the device region 112. Further, the source/drain regions 114 are each spaced from and laterally between two isolation corners 106c.

The isolation corners 106c are top cross-sectional corners of the semiconductor substrate 106 that are in the device region 112 and that border the isolation structure 108. Further, the isolation corners 106c are line shaped and extend laterally in parallel with the selectively-conductive channel 116, from the first end of the device region 112 to the second end of the device region 112. In some embodiments, the isolation corners 106c have the same lengths or have substantially the same lengths. Further yet, the isolation corners 106c are on opposite sides of the device region 112, such that the source/drain regions 114 are each directly between the isolation corners 106c. In some embodiments, the isolation corners 106c are each at a location at which a top surface edge of the device region 112 meets a sidewall surface edge of the device region 112, where the sidewall surface of the sidewall surface edge borders and/or adjoins the isolation structure 108. Further, in some embodiments, the isolation corners 106c directly contact the plate dielectric layer 102.

By spacing the source/drain regions 114 from the isolation corners 106c, the flicker and random telegraph noise of the FET is reduced. Namely, the spacing increases the resistance from the source/drain regions 114 to the isolation corners 106c, such that a low amount of source-drain current flows through the isolation corners 106c. This, in turn, reduces carriers being trapped and de-trapped at the isolation corners 106c, thereby resulting in low flicker and random telegraph noise. As noted above, the isolation corners 106c have a high amount of defect states because the isolation corners 106c have high mechanical stress and are not defined by perfectly planar surfaces. Further, as noted above, the isolation corners 106c have small radiuses of curvature that promote high electric fields.

The plate dielectric layer 102 and the plate 104 are stacked, such that the plate 104 overlies the plate dielectric layer 102. Further, the plate dielectric layer 102 and the plate 104 overlie the device region 112 of the semiconductor substrate 106, as well as the isolation corners 106c. The plate 104 and, in some embodiments, the plate dielectric layer 102 comprise peripheral plate portions 117p that protrude from a central plate portion 117c. The peripheral plate portions 117p respectively cover the isolation corners 106c, and extend laterally in parallel with the isolation corners 106c and the selectively-conductive channel 116. The central plate portion 117c covers the selectively-conductive channel 116, and extends laterally from one of the peripheral plate portions 117p to another one of the peripheral plate portions 117p.

In some embodiments, the plate dielectric layer 102 and the plate 104 completely cover the isolation corners 106c. Further, in some embodiments, the plate dielectric layer 102 and the plate 104 have the same layout, and/or sidewalls of the plate dielectric layer 102 are aligned to sidewalls of the plate 104. Further yet, in some embodiments, the plate dielectric layer 102 and/or the plate 104 each have an H-shaped top layout. Further yet, the plate dielectric layer 102 and/or the plate 104 have a width W that is substantially perpendicular to the isolation corners 106c, and have a length L that is substantially parallel to the isolation corners 106c. The plate dielectric layer 102 may be, for example, silicon dioxide, silicon nitride, a high κ dielectric, some other dielectric, or any combination of the foregoing. As used herein, a high κ dielectric layer is a dielectric with a dielectric constant κ greater than about 3.9, 5, 10, 15, or 20. The plate 104 may be, for example, doped polysilicon, metal, or some other conductive material.

In some embodiments, the plate 104 comprises a first doped region 104a, a second doped region 104b, and a third doped region 104c. The first doped region 104a and the third doped region 104c have the same doping type and may, for example, also have the same doping type as the source/drain regions 114. The first doped region 104a and the third doped region 104c may, for example, be n-type or p-type. The second dope region 104b is disposed between the first doped region 104a and the third doped region 104c and comprises a second doping type opposite the first doping type. For example, in an n-channel MOSFET, the first doped region 104a and the third doped region 104c comprise n-type doped polysilicon and the second doped region 104b comprises p-type doped polysilicon. As another example, in a p-channel MOSFET, the first doped region 104a and the third doped region 104c comprise p-type doped polysilicon and the second doped region 104b comprises n-type doped polysilicon.

The second doped region 104b is within the central plate portion 117c, and extends laterally along the width W of the plate 104. In some embodiments, the second doped region 104b is limited to the central plate portion 117c. For example, the second doped region 104b may extend laterally along the width W of the plate 104 from one of the peripheral plate portions 117p to another one of the peripheral plate portions 117p, and may be sandwiched between the peripheral plate portions 117p. In other embodiments, the second doped region 104b is in both the central plate portion 117c and the peripheral plate portions 117p. For example, the second doped region 104b may extend laterally along the width W of the plate 104 from a sidewall of the plate 104 to another sidewall of the plate 104. In some embodiments, the second doped region 104b is spaced from sidewalls of the plate 104 overlying the selectively-conductive channel 116, and/or has a planar top layout that is line shaped.

The first doped region 104a and the third doped region 104c are within the peripheral plate portions 117p. In some embodiments, the first and third doped regions 104a, 104c are limited to the peripheral plate portions 117p. In other embodiments, the first and third doped regions 104a, 104c are also in the central plate portion 117c. For example, the first doped region 104a and the third doped region 104c may each have a U-shaped top layout spanning the peripheral plate portions 117p and the central plate portion 117c. In some embodiments, the first doped region 104a and the third doped region 104c are separated by the second doped region 104b. As illustrated in FIG. 1D, in other embodiments, the first doped region 104a and the third doped region 104c directly abut in the peripheral plate portions 117p, and/or collectively extend laterally in a closed path to completely enclose the second doped region 104b.

By doping the first doped region 104a and the third doped region 104c with the same doping type as the source/drain regions 114 and the second doped region 104b with a different doping type, the flicker and random telegraph noise of the FET may be kept low. Namely, the arrangement and doping types of the first, second, and third doped regions 104a, 104b, 104c alters the work function of the plate 104 to drive source-drain current flow deeper into the semiconductor substrate 106, thereby moving the current flow away from defect states at an interface between the device region 112 of the semiconductor substrate 106 and the plate dielectric layer 102. This, in turn, reduces trapping and de-trapping of carriers at the defect states, which leads to low flicker and random telegraph noise.

A pair of lateral plate openings 118 is defined by the plate 104 and, in some embodiments, the plate dielectric layer 102. The lateral plate openings 118 extend vertically through the plate 104, from top to bottom, and extend laterally into sides of the plate 104. The lateral plate openings 118 are each laterally between and spaced from the isolation corners 106c. In some embodiments, the lateral plate openings 118 are at a width-wise center of the plate 104 (i.e., at a center of the width W of the plate 104). Further, the lateral plate openings 118 are respectively on opposite sides of the plate 104 and respectively overlie the source/drain regions 114. In some embodiments, the lateral plate openings 118 are laterally spaced along the length L of the plate 104. Further, in some embodiments, the lateral plate openings 118 each have a side that is open, and three sides defined by the plate 104 and, in some embodiments, the plate dielectric layer 102.

In some embodiments, by having the lateral plate openings 118 in the plate 104, and the peripheral plate portions 117p covering the isolation corners 106c, the plate 104 may be employed as a mask to form the source/drain regions 114 spaced from the isolation corners 106c in a planar top layout of the FET. This, in turn, allows a low cost, low complexity process for reducing flicker and random telegraph noise since the same photomask used to pattern the plate 104 may also be used to reduce flicker noise.

With reference to FIGS. 2A-2C and 3A-3C, various views of various more detailed embodiments of the FET of FIGS. 1A-1C are provided in which the FET is a MOSFET. Figures having a suffix of "A" (e.g., FIG. 2A) are top layout views of some embodiments of the MOSFET. Figures having a suffix of "B" (e.g., FIG. 3B) are cross-sectional views of some embodiments of the MOSFET, taken along line A-A' in the figures having a suffix of "A." Figures having a suffix of "C" (e.g., FIG. 2C) are cross-sectional views of some embodiments of the MOSFET, taken along line B-B' in the figures having a suffix of "A."

Figure 2B:
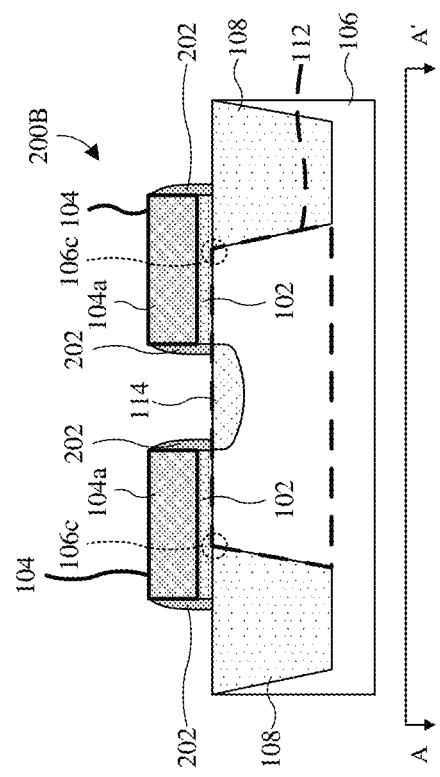
Figure 2C:
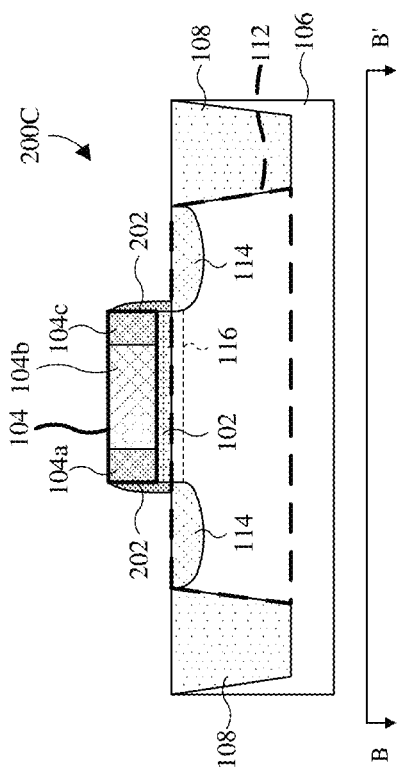
Figure 2A:
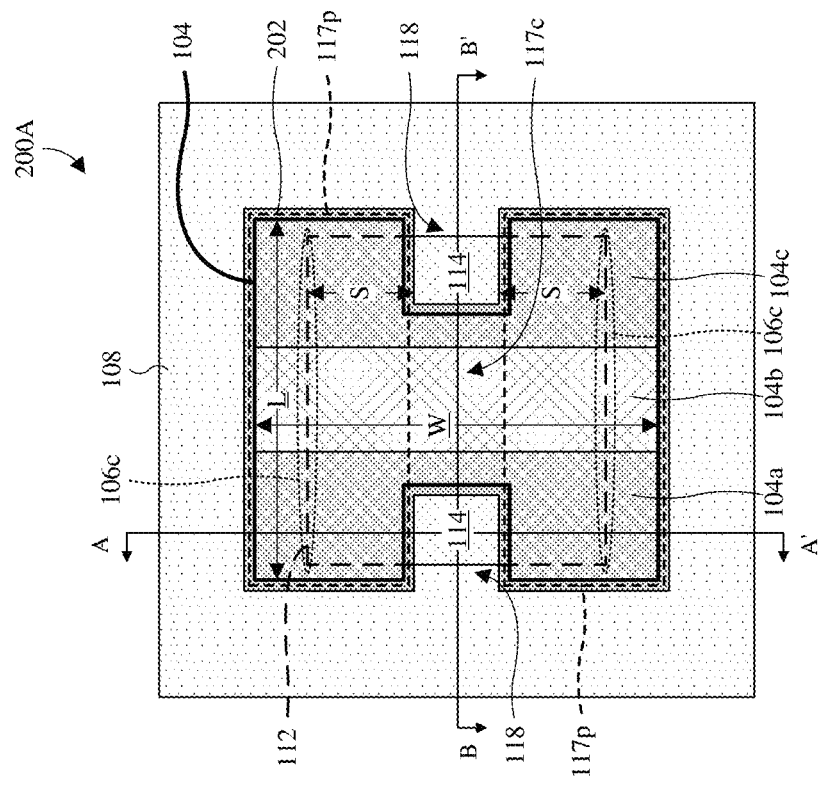

As illustrated by the views 200A-200C of FIGS. 2A-2C, a plate 104 overlaps the isolation corners 106c and is laterally between a pair of source/drain regions 114. A spacer 202 extends laterally along a boundary of the plate 104 to surround the plate 104. Further, the source/drain regions 114 are laterally spaced in a first direction, and are laterally spaced from the isolation corners 106c in a second direction perpendicular to or substantially perpendicular to the first direction. In some embodiments, the source/drain regions 114 are spaced from each of the isolation corners 106c by an amount S in the second direction (see FIG. 2B). As noted above, the FET has reduced flicker and random telegraph noise due this spacing. Further, in some embodiments, the plate 104 has a planar top layout that is H-shaped, and/or has at more than four sidewalls (e.g., 12 sidewalls). Further yet, in some embodiments, the plate 104 has a pair of peripheral plate portions 117p and a central plate portion 117c. The peripheral plate portions 117p respectively cover the isolation corners 106c, and the central plate portion 117c bridges the peripheral plate portions 117p.

A first doped region 104a, a second doped region 104b, and a third doped region 104c are within the central plate portion 117c and the peripheral plate portions 117p. The second dope region 104b is disposed between the first doped region 104a and the third doped region 104c and comprises a doping type opposite that of the first doped region 104a and the third doped region 104c. Further, the second doped region 104b extends laterally along a width W of the plate 104 (see FIG. 2A) from a first sidewall of the plate 104 to a second sidewall of the plate 104. The first doped region 104a and the third doped region 104c are respectively on opposite sides of the second doped region 104b and are laterally spaced by the second doped region 104b along a length L of the plate 104 (see FIG. 2A). Further, the first doped region 104a and the third doped region 104c each have a U-shaped planar top layout that wraps around a respective one of the source/drain regions 114 and that spaces the second doped region 104b from the respective one of the source/drain regions 114. Further yet, the first doped region 104a and the third doped region 104c have the same doping type and may, for example, also have the same doping type as the source/drain regions 114. As noted above, the FET has reduced flicker and random telegraph noise due to the arrangement and doping types of the first, second, and third doped regions 104a, 104b, 104c altering the work function of the plate 104 to drive current flow to a deeper portion of the semiconductor substrate 106.

As illustrated by the views 300A-300C of FIGS. 3A-3C, a plate 302 overlaps the isolation corners 106c and is laterally between a pair of source/drain regions 114. The plate 302 is undoped or comprises a single doping type, such as, for example, n-type or p-type. In some embodiments where the FET is an n-channel MOSFET, the plate 302 comprises p-type doped polysilicon. In other embodiments, where the FET is a p-channel MOSFET, the plate 302 comprises n-type doped polysilicon. Further, the plate 302 may, for example, be as the plate 104 of FIGS. 2A-2C is described, except that the plate lacks the first, second, and third doped regions 104a, 104b, 104c.

Figure 5B:
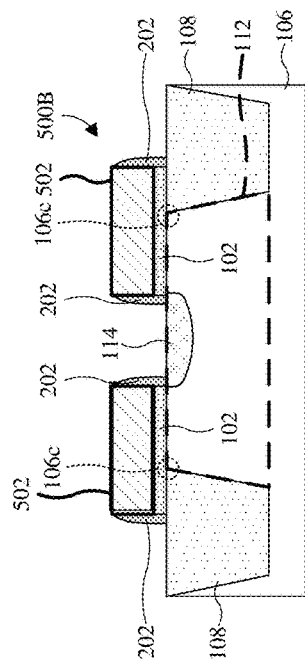
Figure 5C:
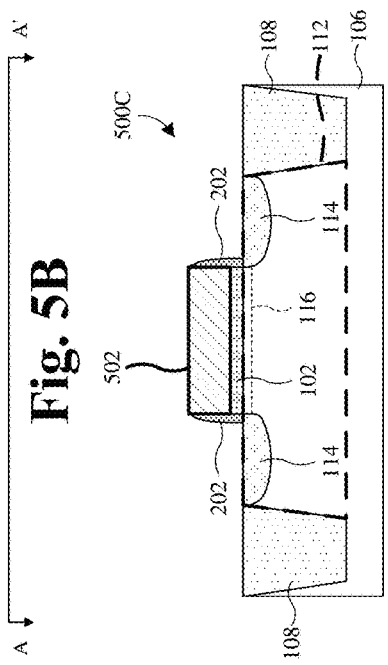
Figure 5D:
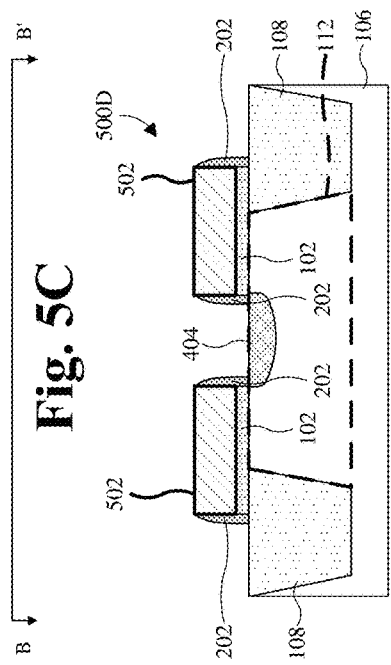
Figure 5A:
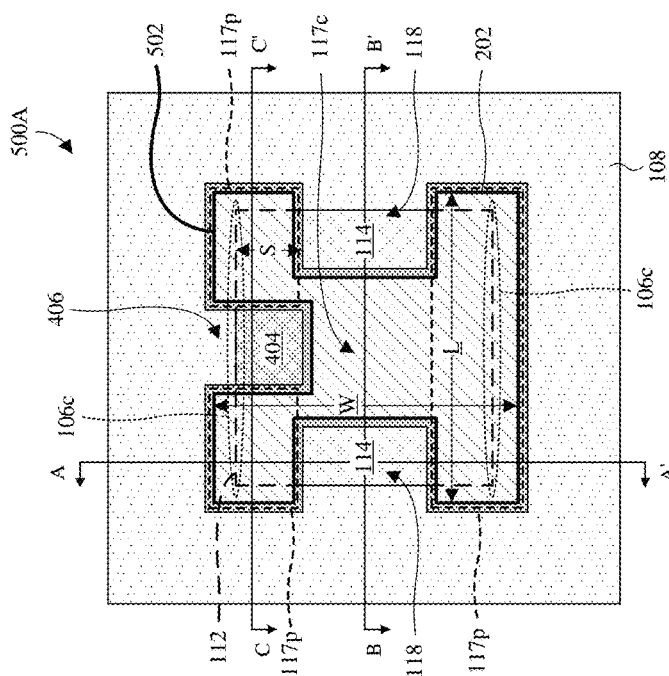

With reference to FIGS. 4A-4D through 7A-7D, various views of various more detailed embodiments of the FET of FIGS. 1A-1C are provided in which the FET is a JFET. Figures having a suffix of "A" (e.g., FIG. 5A) are top layout views of some embodiments of the JFET. Figures having a suffix of "B" (e.g., FIG. 6B) are cross-sectional views of some embodiments of the JFET, taken along line A-A' in the figures having a suffix of "A." Figures having a suffix of "C" (e.g., FIG. 4C) are cross-sectional views of some embodiments of the JFET, taken along line B-B' in the figures having a suffix of "A." Figures having a suffix of "D" (e.g., FIG. 5D) are cross-sectional views of some embodiments of the JFET, taken along line C-C' in the figures having a suffix of "A."

As illustrated by the views 400A-400D of FIGS. 4A-4D, a plate 402 overlaps the isolation corners 106c and is laterally between a pair of source/drain regions 114. The plate 402 may be, for example, doped polysilicon, metal, or some other conductive material. The source/drain regions 114 are laterally spaced in a first direction, and are laterally spaced from and between the isolation corners 106c in a second direction perpendicular to or substantially perpendicular to the first direction. As noted above, the FET has reduced flicker and random telegraph noise due to this spacing. In some embodiments, the source/drain regions 114 have the same doping type, but a higher doping concentration, than a bulk of the device region 112. A gate region 404 is over and in the device region 112, and is laterally between the source/drain regions 114. Further, the gate region 404 is spaced from each of the source/drain regions 114 in the first direction. In other embodiments, the gate region 404 is not spaced from each of the source/drain regions 114 in the first direction. In some embodiments, a first side of the gate region 404 abuts the selectively-conductive channel 116 (See FIGS. 1A-1D and FIG. 4C), and a second side opposite the first side abuts the isolation structure 108 at one of the isolation corners 106c. The gate region 404 has an opposite doping type as the source/drain regions 114 and, in some embodiments, has an opposite doping type as the bulk of the device region 112. For example, the source/drain regions 114 may be n-type and the gate region 404 may be p-type, or vice versa.

The plate 402 comprises peripheral plate portions 117p that respectively cover the isolation corners 106c, and a central plate portion 117c that bridges the peripheral plate portions 117p. In some embodiments, the plate 402 has a concave polygonal layout comprising at least sixteen sides. Further, the plate 402 comprises a first doped region 104a, a second doped region 104b, and a third doped region 104c. The second doped region 104b is disposed within the central plate portion 117c, and in some embodiments, the second doped region 104b. The second doped region 104b extends laterally along the width W of the plate 402, into the peripheral plate portions 117p, to sidewalls of the plate 402. In some embodiments, the second doped region 104b separates the first doped region 104a and the third doped region 104c from the gate region 404. The second doped region 104b may, for example, have the same doping type as the gate region 404, and/or the first and third doped region 104a, 104c may, for example, have an opposite doping type as the gate region 404. As noted above, the FET has reduced flicker and random telegraph noise due to the arrangement and doping types of the first, second, and third doped regions 104a, 104b, 104c altering the work function of the plate 402 to drive current flow into a deeper portion of the selectively-conductive channel 116 (see, FIGS. 1A-1D and FIG. 4C).

A lateral gate opening 406 is defined by the plate 402 and, in some embodiments, the plate dielectric layer 102. The lateral gate opening 406 extends vertically through the plate 402, from top to bottom, and extends laterally into a side of the plate 402. The lateral gate opening 406 is laterally spaced between the source/drain regions 114 and borders one of the isolation corners 106c. In some embodiments, the lateral gate opening 406 is at a length-wise center of the plate 402 (i.e., at a center of the length L of the plate 402). Further, the lateral gate opening 406 overlies the gate region 404. In some embodiments, the lateral gate opening 406 has a side that is open, and three sides defined by the plate 402 and, in some embodiments, the plate dielectric layer 102.

As illustrated by the views 500A-500D of FIGS. 5A-5D, a plate 502 overlaps the isolation corners 106c and is laterally between a pair of source/drain regions 114. The source/drain regions 114 are laterally spaced in a first direction, and the gate region 404 is laterally between and spaced from each source/drain region 114 in the first direction. The plate 502 is undoped or comprises a single doping type, such as, for example, n-type or p-type. In some embodiments, the plate 502 comprises doped polysilicon with the same doping type as the gate region 404.

As illustrated by the views 600A-600D of FIGS. 6A-6D, a plate 602 overlaps the isolation corners 106c and is laterally between a pair of source/drain regions 114. The plate 402 may be, for example, doped polysilicon, metal, or some other conductive material. The source/drain regions 114 are laterally spaced in a first direction, and are laterally spaced between the isolation corners 106c in a second direction perpendicular to or substantially perpendicular to the first direction. As noted above, the FET has reduced flicker and random telegraph noise due to the spacing between the isolation corners 106c and the source/drain regions 114. In some embodiments, the source/drain regions 114 have the same doping type, but a higher doping concentration, than a bulk of the device region 112. A pair of gate regions 604 is over and in the device region 112, and the gate regions 604 are laterally between a pair of source/drain regions 114. Further, the gate regions 604 are each spaced from the source/drain region 114 in the first direction, and are laterally spaced from each other in the second direction. In some embodiments, each of the gate regions 604 has a first side abutting the selectively-conductive channel 116 (See FIGS. 1A-1C and FIG. 6C), and a second side opposite the first side abutting the isolation structure 108 at a respective one of the isolation corners 106c. The gate regions 404 have the same doping type. Further, the gate regions 404 have an opposite doping type as the source/drain regions 114 and, in some embodiments, have an opposite doping type as the bulk of the device region 112.

The plate 602 comprises peripheral plate portions 117p that respectively cover the isolation corners 106c, and a central plate portion 117c that bridges the peripheral plate portions 117p. In some embodiments, the plate 602 has a polygonal-shaped layout comprising at least twenty sides.

Further, the plate 602 comprises a first doped region 104a, a second doped region 104b, and a third doped region 104c. The second doped region 104b is disposed within the central plate portion 117c and extends laterally along the width W of the plate 602, into the peripheral plate portions 117p, to sidewalls of the plate 602. In some embodiments, the second doped region 104b separates the first doped region 104a and the third doped region 104c from each of the gate regions 604. The second doped region 104b may, for example, have the same doping type as the gate regions 404, and/or the first and third doped regions 104a, 104c may, for example, have an opposite doping type as the gate regions 404. As noted above, the FET has reduced flicker and random telegraph noise due to the arrangement and doping types of the first, second, and third doped regions 104a, 104b, 104c altering the work function of the plate 602 to drive current flow to a deeper portion of the selectively-conductive channel 116.

Figure 6B:
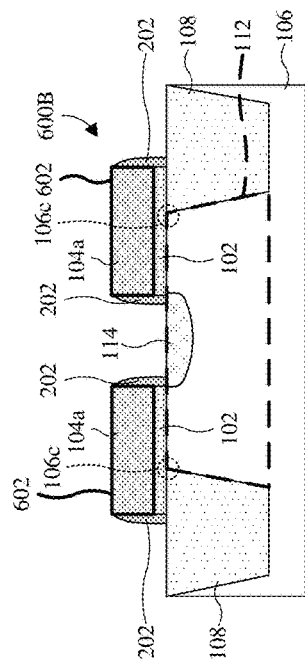
Figure 6C:
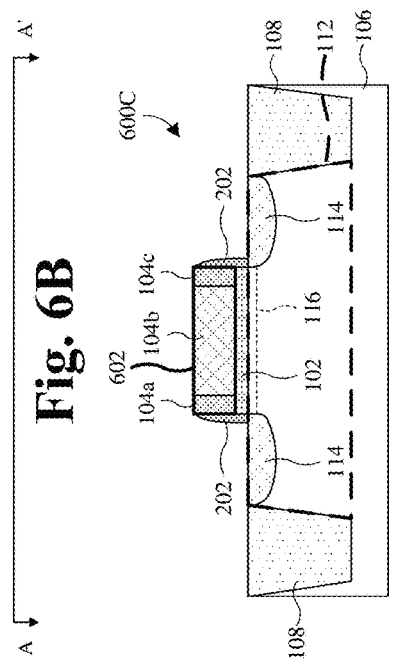
Figure 6D:
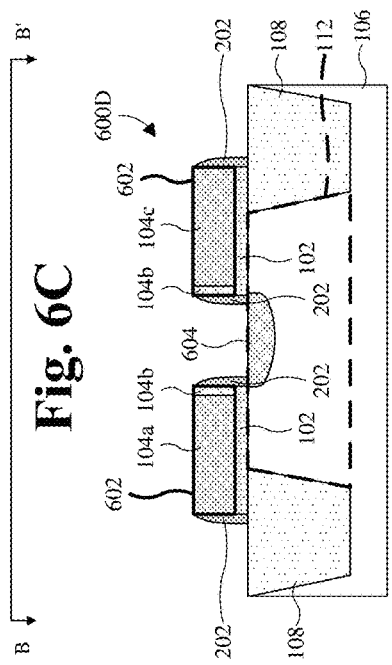
Figure 6A:
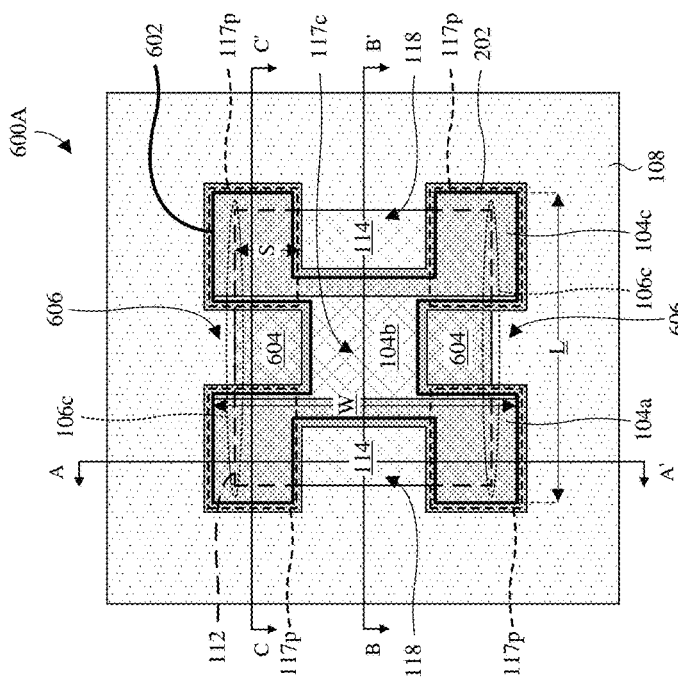
Figure 8A:
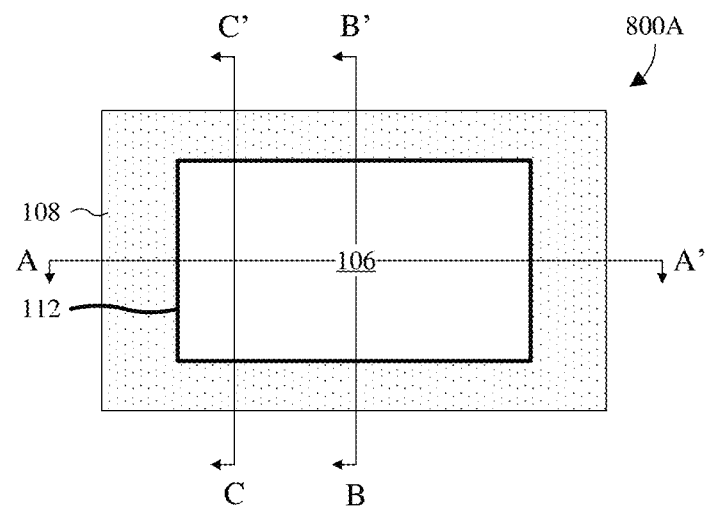
Figure 8B:
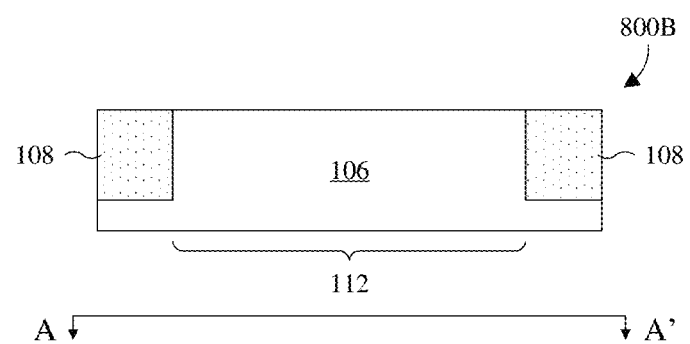

A pair of lateral gate openings 606 is defined by the plate 602 and, in some embodiments, the plate dielectric layer 102 (See FIGS. 6B-6D). The lateral gate openings 606 extend vertically through the plate 602, from top to bottom, and extend laterally into sides of the plate 602. The lateral gate openings 606 are each laterally spaced between the source/drain regions 114. In some embodiments, the lateral gate openings 606 are at a length-wise center of the plate 602 (i.e., at a center of the length L of the plate 602). Further, the lateral gate openings 606 are respectively on opposite sides of the plate 602 and respectively overlie the gate regions 604. In some embodiments, the lateral gate openings 606 are laterally spaced along the width W of the plate 602. Further, in some embodiments, the lateral gate openings 606 each have a side that is open, and three sides defined by the plate 602 and, in some embodiments, the plate dielectric layer 102.

As illustrated by the views 700A-700D of FIGS. 7A-7D, a plate 702 overlaps the isolation corners 106c and is laterally between a pair of source/drain regions 114. The source/drain regions 114 are laterally spaced in a first direction, and the gate regions 604 are laterally spaced in a second direction orthogonal or substantially orthogonal to the first direction. Further, each of the gate regions 604 are laterally spaced from the source/drain regions 114 in the first direction. The plate 702 is undoped or comprises a single doping type, such as, for example, n-type or p-type. In some embodiments, the plate 702 comprises doped polysilicon with the same doping type as the gate regions 404.

Figure 9B:
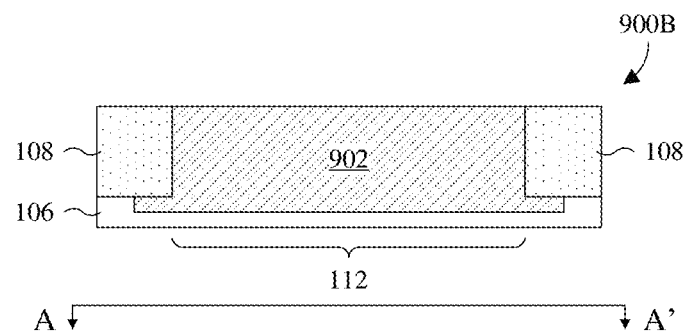
Figures 9C, 9D:
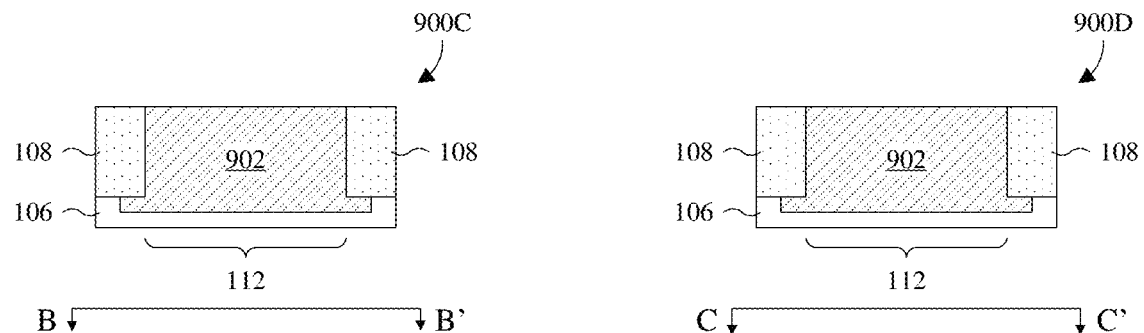
Figure 10A:
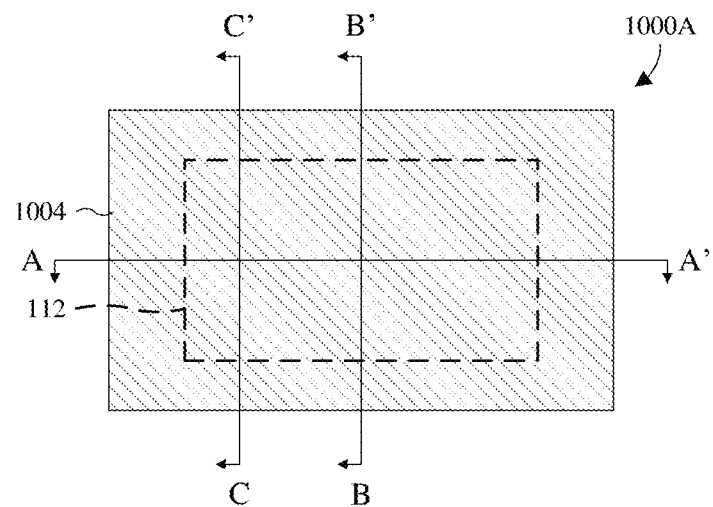
Figure 10B:
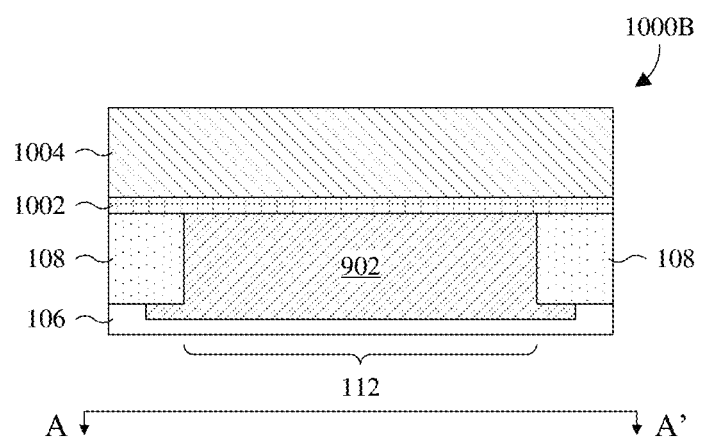
Figures 10C, 10D:
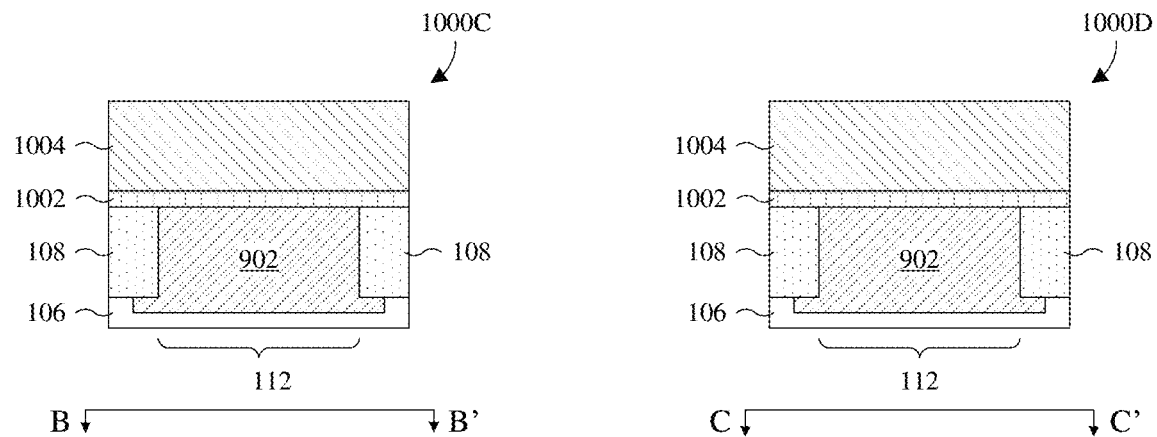
Figure 11A:
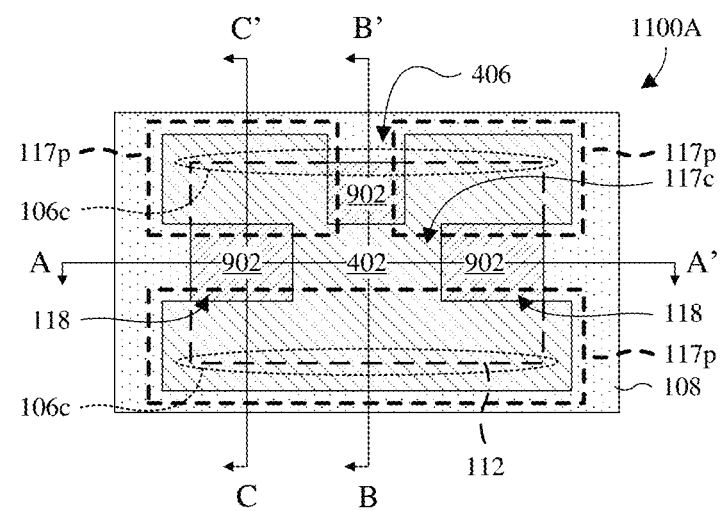
Figure 11B:
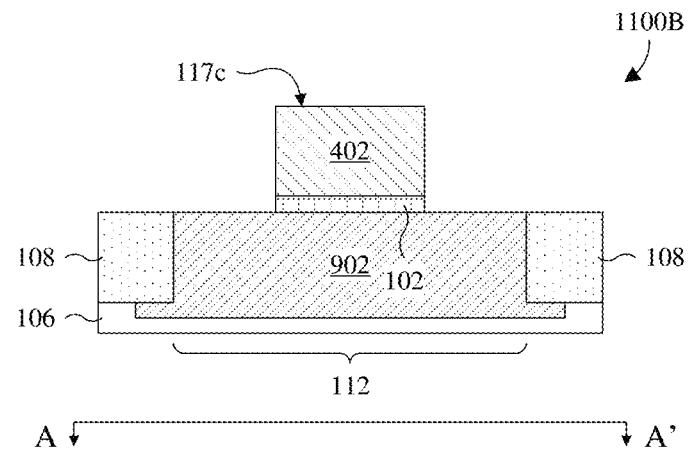
Figures 11C, 11D:
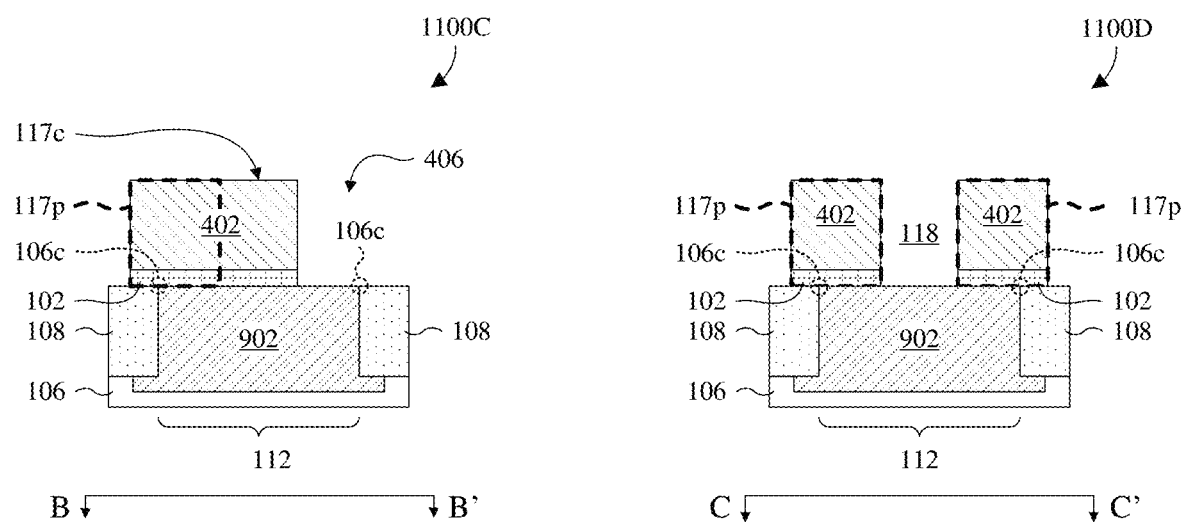
Figure 12A:
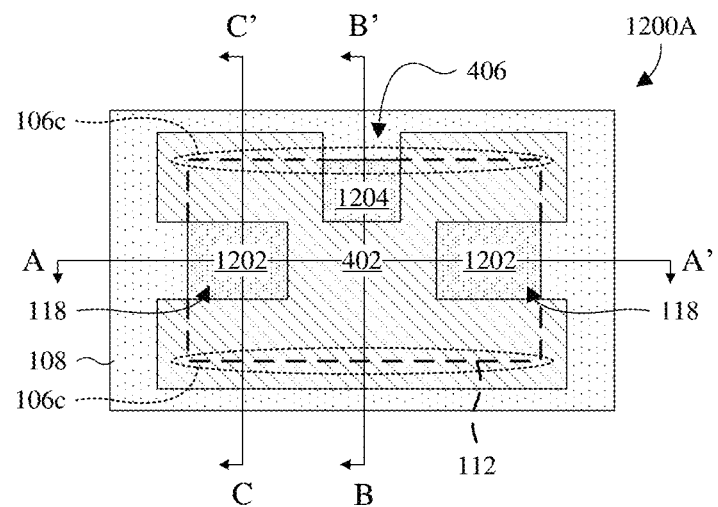
Figure 12B:
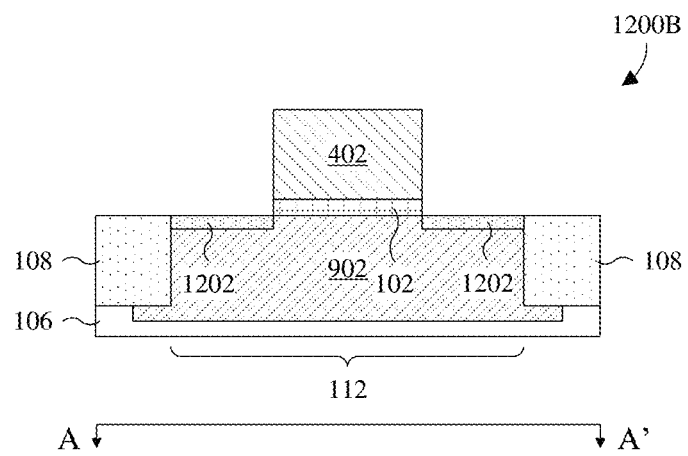
Figures 12C, 12D:
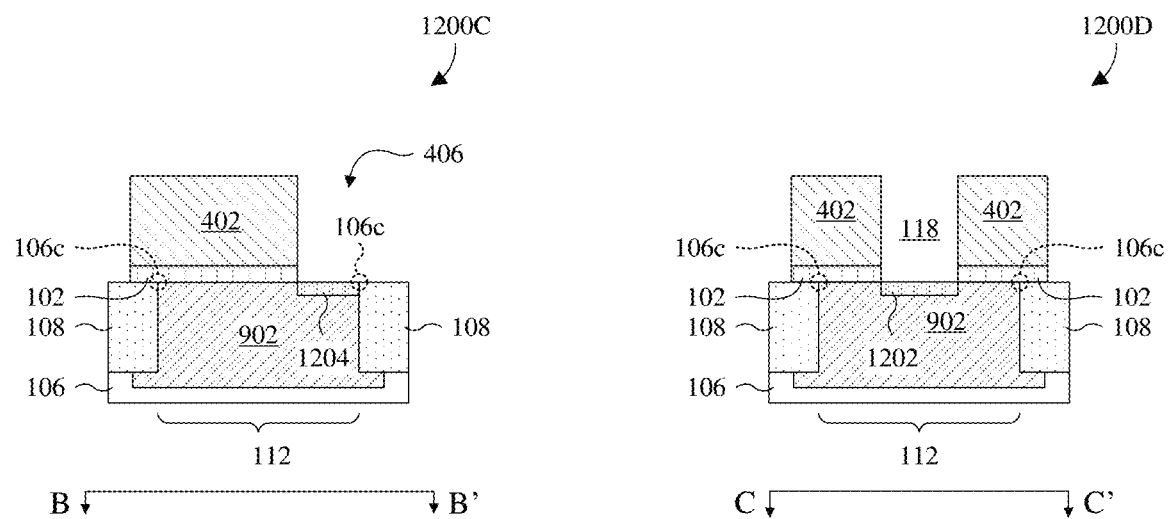
Figure 13A:
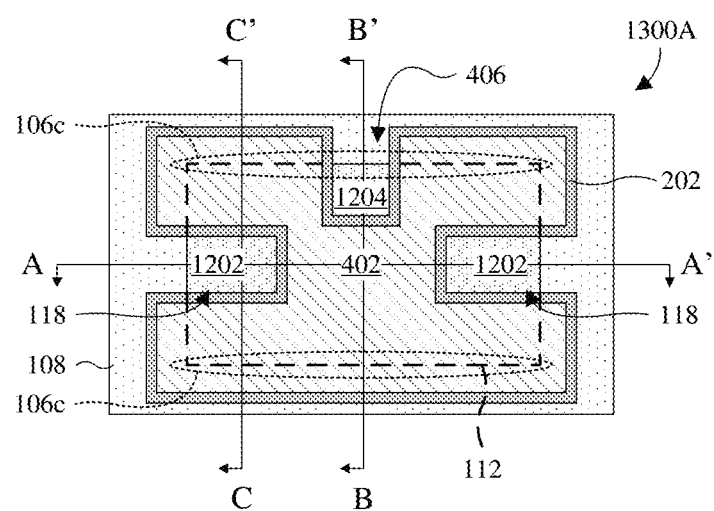
Figure 14A:
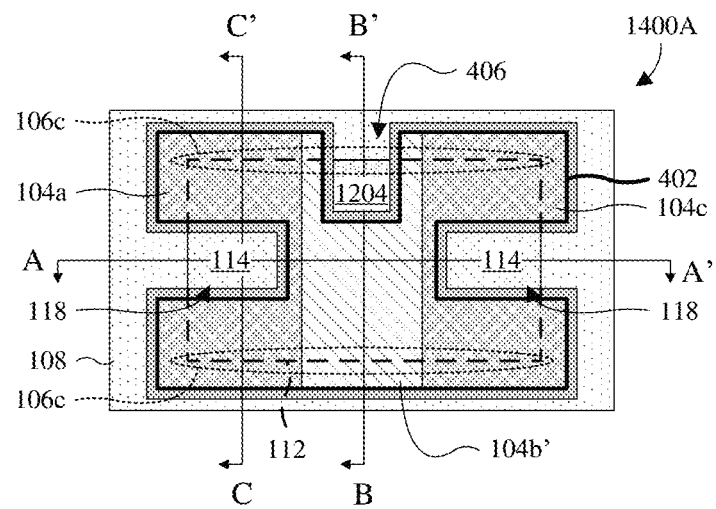
Figure 14B:
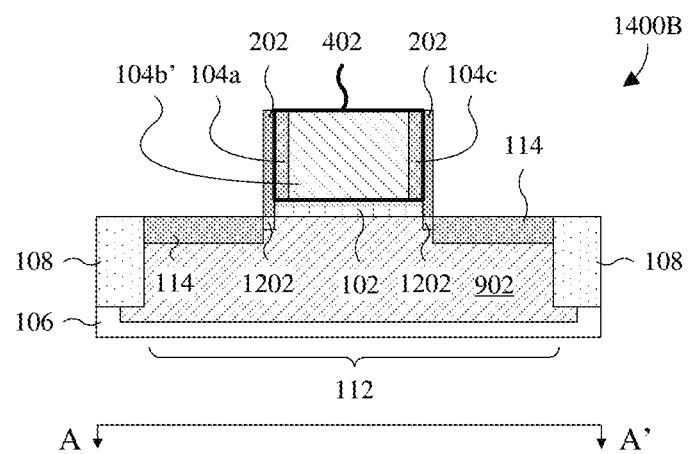
Figure 14C:
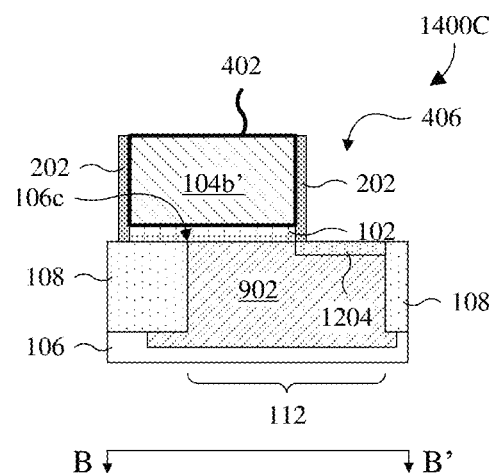
Figure 14D:
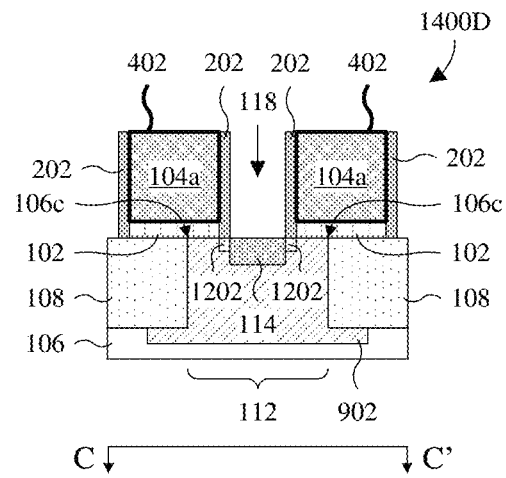
Figure 15A:
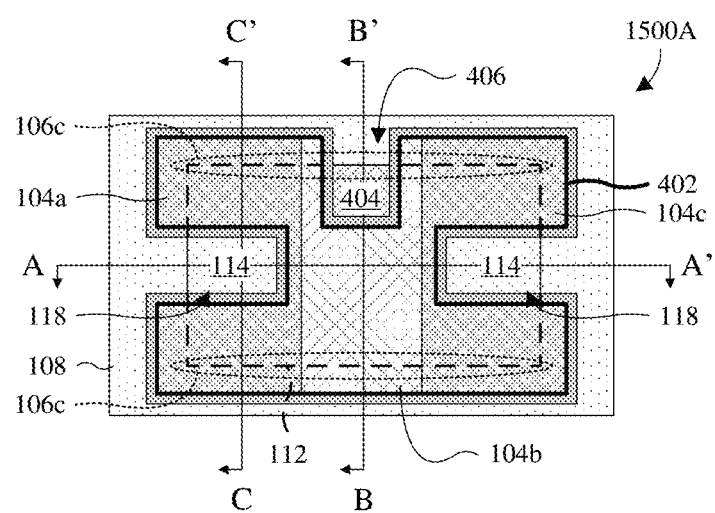
Figure 16A:
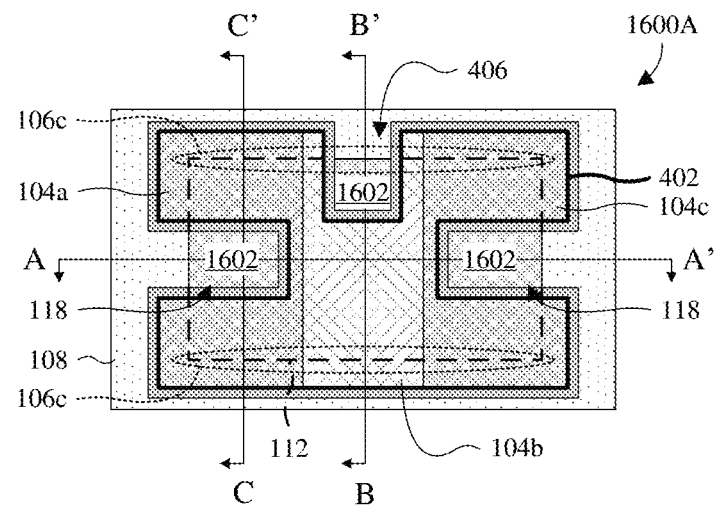
Figure 16B:
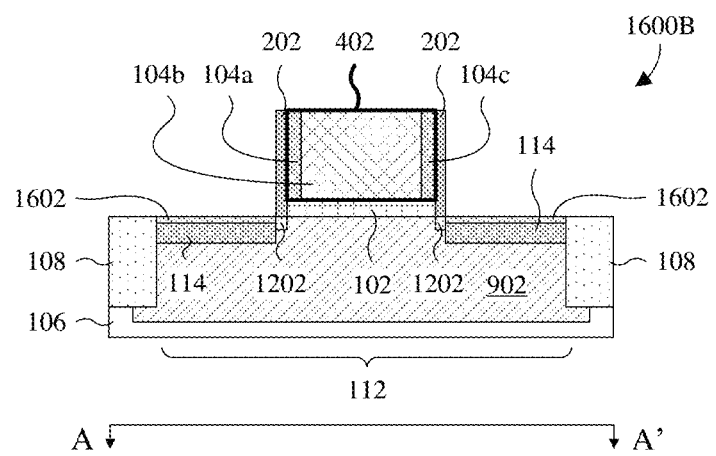
Figure 16C:
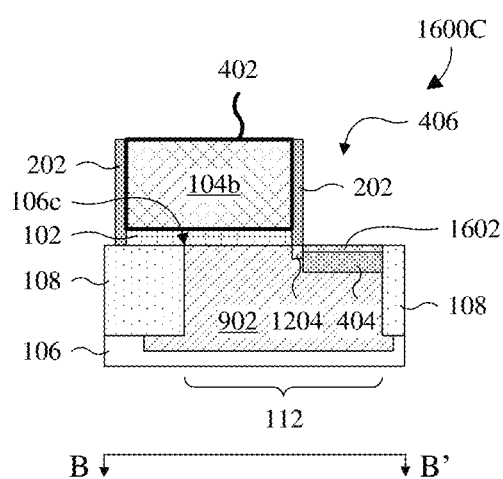
Figure 16D:
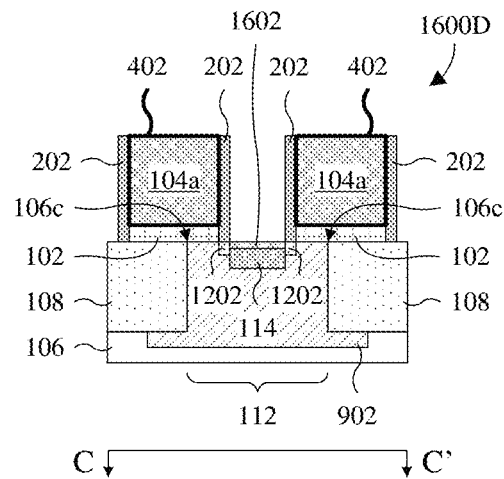
Figure 17A:
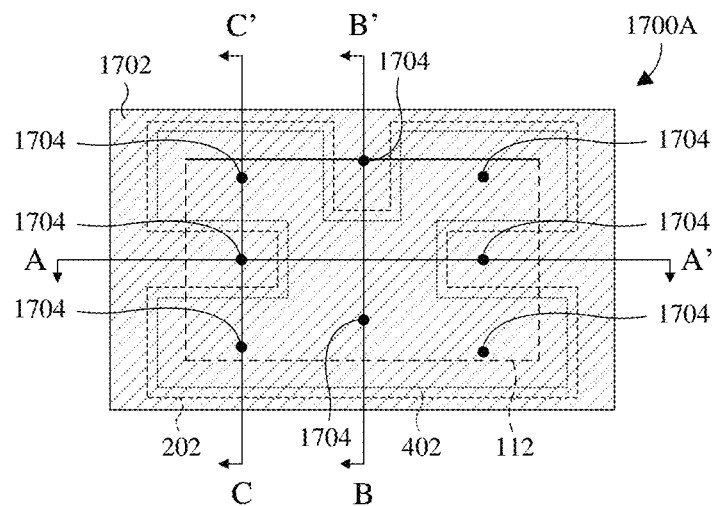
Figure 17B:
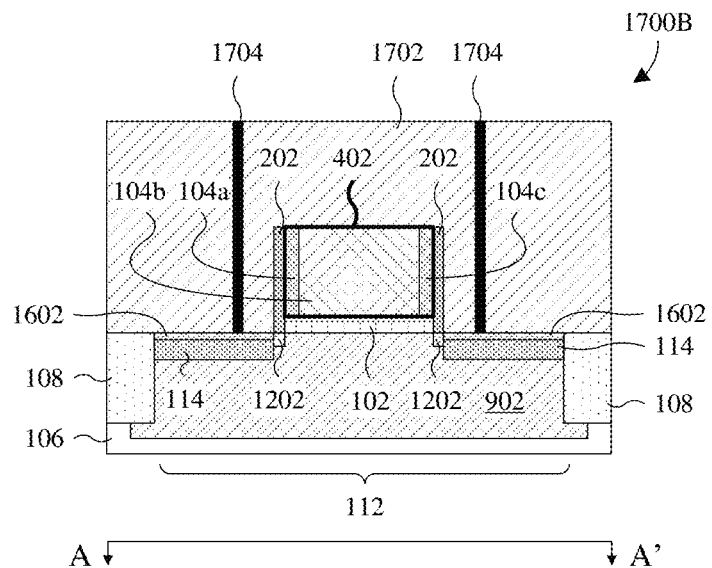
Figures 17C, 17D:
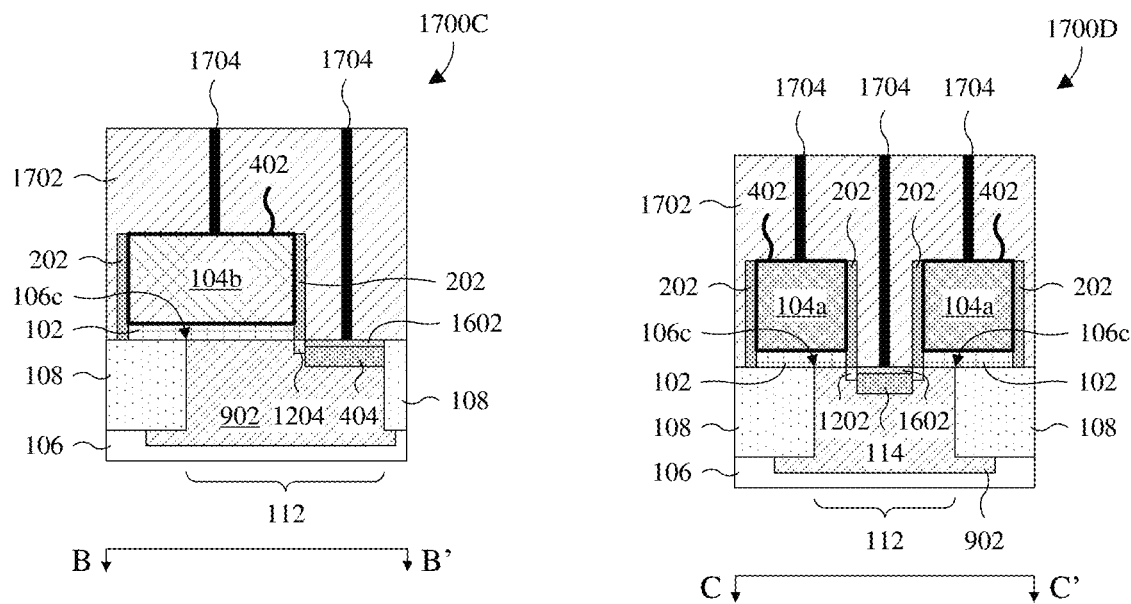

With reference to FIGS. 8A-8D through 17A-17D, a series of views 800A-800D through 1700A-1700D of some embodiments of a method for manufacturing a FET with reduced flicker and random telegraph noise is provided. Figures having a suffix of "A" (e.g., FIG. 8A) are top views of the FET under manufacture. Figures having a suffix of "B" (e.g., FIG. 9B) are cross-sectional views of the FET manufacture, taken along line A-A' in the figures having a suffix of "A". Figures having a suffix of "C" (e.g., FIG. 10C) are cross-sectional views of the FET under manufacture, taken along line B-B' in the figures having a suffix of "A". Figures having a suffix of "D" (e.g., FIG. 11D) are cross-sectional views of the FET under manufacture, taken along line C-C' in the figures having a suffix of "A". The FET may, for example, be the FET of FIGS. 4A-4D.

As illustrated by the views 800A-800D of FIGS. 8A-8D, an isolation structure 108 is formed over the semiconductor substrate 106, sunken into a top of the semiconductor substrate 106. Further, the isolation structure 108 is formed demarcating a device region 112 of the semiconductor substrate 106. In some embodiments, the device region 112 of the semiconductor substrate 106 has a polygonal layout, and/or the isolation structure 108 has a polygonal ring-shaped layout. The isolation structure 108 may be, for example, an STI or DTI region, and/or the semiconductor substrate 106 may be, for example, a bulk substrate of monocrystalline or polycrystalline silicon or some other type of semiconductor substrate.

In some embodiments, a process for forming the isolation structure 108 comprises performing an etch into the semiconductor substrate 106 to form a trench in the semiconductor substrate 106, and subsequently filling the trench with a dielectric material. The trench may, for example, be formed with the desired layout of the isolation structure, and/or the dielectric material may be, for example, silicon dioxide.

As illustrated by the views 900A-900D of FIGS. 9A-9D, in some embodiments, a well 902 is formed in the device region 112 of the semiconductor substrate 106. The well 902 is a region of the semiconductor substrate 106 having an n-type doping or a p-type doping. Further, in some embodiments, the well 902 has a doping type opposite that of adjoining regions of the semiconductor substrate 106, or the adjoining regions of the semiconductor substrate 106 are intrinsic. The well 902 may, for example, be formed by ion implantation.

As illustrated by the views 1000A-1000D of FIGS. 10A-10D, a dielectric layer 1002 and a conductive layer 1004 are formed on the isolation structure 108 and the device region 112 of the semiconductor substrate 106, such that the conductive layer 1004 overlies the dielectric layer 1002. The dielectric layer 1002 may, for example, be silicon dioxide, a high κ dielectric, or some other dielectric, and/or the conductive layer 1004 may be, for example, doped polysilicon, metal, or some other conductive. In other embodiments, the conductive layer 1004 is polysilicon that undergoes a subsequent doping process by, for example, ion implantation.

In some embodiments, a process for forming the dielectric layer 1002 and the conductive layer 1004 comprises depositing or growing the dielectric layer 1002 on the isolation structure 108 and the device region 112 of the semiconductor substrate 106, and subsequently depositing or growing the conductive layer 1004 on the dielectric layer 1002. The dielectric layer 1002 may, for example, be deposited or grown by thermal oxidation, chemical or physical vapor deposition, sputtering, or some other deposition or growth process. The conductive layer 1004 may, for example, be deposited or grown by chemical or physical vapor deposition, sputtering, electrochemical plating, electroless plating, or some other deposition or growth process.

As illustrated by the views 1100A-1100D of FIGS. 11A-11D, the conductive layer 1004 (see FIGS. 10A-10D) and the dielectric layer 1002 (see FIGS. 10A-10D) are patterned respectively into a plate 402 and a plate dielectric layer 102. The plate 402 and the plate dielectric layer 102 are stacked on the isolation structure 108 and the device region 112 of the semiconductor substrate 106, such that plate 402 overlies the plate dielectric layer 102. Further, the plate 402 and the plate dielectric layer 102 overlap a pair of isolation corners 106c of the semiconductor substrate 106. The isolation corners 106c are top cross-sectional corners of the semiconductor substrate 106 that border the isolation structure 108 in the device region 112 and that adjoin the plate dielectric layer 102. Further, the isolation corners 106c are line shaped and extend laterally in parallel in a first direction from a first end of the device region 112 to a second end of the device region 112 opposite the first end. The plate 402 and the plate dielectric layer 102 define a pair of lateral plate openings 118 respectively on the first and second ends of the device region 112. Further, the lateral plate openings 118 are each laterally spaced between the isolation corners 106c in the second direction. Further, in some embodiments, the plate 402 and the plate dielectric layer 102 define a lateral gate opening 406 that is laterally spaced between the lateral plate openings 118 in the first direction and that borders one of the isolation corners 106c. In further embodiments, the lateral gate opening 406 is paired with another lateral gate opening on an opposite side of the plate 104. See, for example, FIGS. 6A-6D.

In some embodiments, the plate 402 and the plate dielectric layer 102 have a polygonal-shaped layout comprising sixteen sides. In other embodiments, the polygonal shaped-layout has more (or less) than sixteen sides. Further, in some embodiments, the plate 402 and the plate dielectric layer 102 have a plurality of peripheral plate portions 117p and a central plate portion 117c. The peripheral plate portions 117p protrude from the central plate portion 117c. In some embodiments, a first one the peripheral plate portions 117p extends laterally in the first direction, from the first end of the device region 112 to the second end of the device region 112. A second one of the peripheral plate portions 117p extends laterally in the first direction, from the first end of the device region 112 to a first side of the lateral gate opening 406. A third one of the peripheral plate portions 117p extends laterally in the first direction, from a second side of the lateral gate opening 406 opposite the first side to the second end of the device region 112. Further, the peripheral plate portions 117p respectively cover the isolation corners 106c. The central plate portion 117c is between the peripheral plate portions 117p, and interconnects the peripheral plate portions 117p.

In some embodiments, a process for patterning the conductive layer 1004 and the dielectric layer 1002 into the plate 402 and the plate dielectric layer 102 comprises forming a patterned photoresist layer (not shown) on the conductive layer 1004. The patterned photoresist layer may, for example, be formed by a spin on process. The patterned photoresist layer may, for example, be patterned with a layout of the plate 402 and may, for example, be patterned using photolithography. Further, in some embodiments, the process comprises performing an etch into the conductive layer 1004 and the dielectric layer 1002 with the patterned photoresist layer in place, and subsequently stripping the patterned photoresist layer.

As illustrated by the views 1200A-1200D of FIGS. 12A-12D, in some embodiments, a pair of lightly-doped source/drain extensions 1202 is formed in the device region 112 of the semiconductor substrate 106. The lightly-doped source/drain extensions 1202 are respectively on opposite sides of the device region 112 of the semiconductor substrate 106, and respectively underlie the lateral plate openings 118 in the plate dielectric layer 102 and the plate 402. Further, the lightly-doped source/drain extensions 1202 are laterally spaced from one another in a first direction, and are laterally spaced from the isolation corners 106c in a second direction transverse (e.g., perpendicular or substantially perpendicular) to the first direction. In some embodiments (e.g., where the FET is a MOSFET), the lightly-doped source/drain extensions 1202 may, for example, be doped regions of the semiconductor substrate 106 with an opposite doping type as the well 902. In other embodiments (e.g., where the FET is a JFET), the lightly-doped source/drain extensions 1202 may, for example, be doped regions of the semiconductor substrate 106 with the same doping type as the well 902, but a different doping concentration as the well 902. In yet other embodiments, the lightly-doped source/drain extension 1202 are not formed. In some embodiments, the lightly-doped source/drain extensions 1202 may, for example, be formed by ion implantation, and/or may, for example, be formed using the plate 402 as a mask.

In some embodiments, a lightly-doped gate extension 1204 is also formed in the device region 112 of the semiconductor substrate 106. The lightly-doped gate extension 1204 underlies the lateral gate opening 406 in the plate dielectric layer 102 and the plate 402, and further has a single sidewall adjoining the isolation structure 108 at one of the isolation corners 106c. In some embodiments, the lightly-doped gate extension 1204 is paired with another lightly-doped gate extension 1204 on an opposite side of the plate 104 and underlying another lateral gate opening 606. See, for example, FIGS. 6A-6D. The lightly-doped gate extension 1204 may, for example, be a doped region of the semiconductor substrate 106 with a different doping type as the well 902. In some embodiments, the lightly-doped gate extension 1204 is formed by ion implantation, and/or formed using the plate 402 as a mask. In some embodiments, when forming both the lightly-doped source/drain extensions 1202 and the lightly-doped gate extension 1204, a photoresist mask is employed to cover the lightly-doped source/drain extensions 1202 while forming the lightly-doped gate extension 1204 by ion implantation process, or vice versa.

As illustrated by the views 1300A-1300D of FIGS. 13A-13D, a spacer 202 is formed on sidewalls of the plate 402 and the plate dielectric layer 102. Further, in some embodiments, the spacer 202 is formed completely enclosing the plate 402 and the plate dielectric layer 102. The spacer 202 may, for example, be silicon nitride, silicon dioxide, some other dielectric, or a combination of the foregoing.

In some embodiments, a process for forming the spacer 202 comprises depositing or growing a spacer layer covering and conformally lining the structure in FIGS. 12A-12D. The spacer layer may, for example, be deposited or grown by chemical or physical vapor deposition, sputtering, or some other deposition or growth process. Further, in some embodiments, the process comprises performing an etch back into the spacer layer to remove horizontal segments of the spacer layer without removing vertical segments of the spacer layer. A remaining vertical segment corresponds to the spacer 202.

As illustrated by the views 1400A-1400D of FIGS. 14A-14D, a pair of source/drain regions 114 is formed in the device region 112 of the semiconductor substrate 106, and a first doped region 104a and a third doped region 104c are formed in the plate 402. The source/drain regions 114 are formed laterally spaced from one another in a first direction, and laterally spaced from the isolation corners 106c in a second direction transverse (e.g., perpendicular or substantially perpendicular) to the first direction. As noted above, the FET has reduced flicker and random telegraph noise due to the spacing between the isolation corners 106c and the source/drain regions 114. Further, the source/drain regions 114 are respectively on opposite sides of the device region 112 of the semiconductor substrate 106, and respectively underlie the lateral plate openings 118 in the plate dielectric layer 102 and the plate 402. The source/drain regions 114 respectively adjoin the lightly-doped source/drain extensions 1202. In some embodiments (e.g., where the FET is a JFET), the source/drain regions 114 may, for example, be regions of the semiconductor substrate 106 with the same doping type as the well 902. In other embodiments (e.g., where the FET is a MOFSET), the source/drain regions 114 may, for example, be regions of the semiconductor substrate 106 with an opposite doping type as the well 902. Further, the source/drain regions 114 may, for example, have the same doping type (e.g., p-type or n-type) as the lightly-doped source/drain extensions 1202 and/or a higher doping concentration than the lightly-doped source/drain extensions 1202.

The first doped region 104a and the third doped region 104c are formed laterally spaced from one another in a first direction by the second region 104b'. The first doped region 104a of the plate 402 wraps around one of the source/drain regions 114, and the third doped region 104c of the plate 402 wraps around another one of the source/drain regions 114. Further, in some embodiments, the first doped region 104a and the third doped region 104c are each laterally spaced from the lateral gate opening 406 in the first direction. In some embodiments, the first doped region 104a and the third doped region 104c may, for example, be regions of the plate 402 with the same doping type as the source/drain regions 114.

In some embodiments, a process for forming the source/drain regions 114, the first doped region 104a, and the third doped region 104c comprises forming a patterned photoresist layer (not shown) on the structure in FIGS. 13A-13D and subsequently performing an ion implantation process. The patterned photoresist layer may, for example, be formed by a spin on process. The patterned photoresist layer may, for example, be patterned with a layout covering structure surrounding the device region 112, and further covering the exposed lightly-doped gate extension 1204 and the second region 104b'. Further, in some embodiments, the process comprises performing an ion implantation into the plate 402 and the semiconductor substrate 106 with the patterned photoresist layer in place, and subsequently stripping the patterned photoresist.

As illustrated by the views 1500A-1500D of FIGS. 15A-15D, a gate region 404 is formed in the device region 112 of the semiconductor substrate 106, and a second doped region 104b is formed in the plate 104. The gate region 404 is formed laterally between and spaced from the source/drain regions 114. Further, the gate region 404 adjoins a single sidewall of the isolation structure 108 at one of the isolation corners 106c, and underlies the lateral gate opening 406 in the plate dielectric layer 102 and the plate 402. In some embodiments, the gate region 404 is paired with another gate region on an opposite side of the plate 104. See, for example, FIGS. 6A-6D. In some embodiments, the gate region 404 adjoins the lightly-doped gate extensions 1204. The gate region 404 may, for example, be a region of the semiconductor substrate 106 with an opposite doping type as the source/drain regions 114 and/or the well 902. Further, the gate region 404 may, for example, have the same doping type (e.g., p-type or n-type) as the lightly-doped gate extension 1204 and/or a higher doping concentration than the lightly-doped gate extension 1204.

The second doped region 104b is formed in the plate 402 between the first doped region 104a and the third doped region 104c, such that the second doped region 104b is laterally spaced from the source/drain regions 114 by the first doped region 104a and the third doped region 104c. Further, in some embodiments, the second doped region 104b wraps around the lateral gate opening 406. In some embodiments, the second doped region 104b is a region of the plate 402 with the same doping type as the gate region 404. As noted above, the FET has reduced flicker and random telegraph noise due to the arrangement and doping types of the first, second, and third doped regions 104a, 104b, 104c altering the work function of the plate 104 to drive current flow deeper into the selectively-conductive channel 116.

In some embodiments, a process for forming the gate region 404 and the second doped region 104b comprises forming a patterned photoresist layer (not shown) on the structure in FIGS. 14A-14D and subsequently performing an ion implantation process. The patterned photoresist layer may, for example, be formed by a spin on process. The patterned photoresist layer may, for example, be patterned with a layout covering the first doped region 104a, the third doped region 104c, and the source/drain regions 114, such that a top surface of the plate 402 is partially exposed between the first doped region 104a and the third doped region 104c. Further, in some embodiments, the process comprises performing an ion implantation into the plate 402 and the semiconductor substrate 106 with the patterned photoresist layer in place, and subsequently stripping the patterned photo resist.

As illustrated by the views 1600A-1600D of FIGS. 16A-16D, in some embodiments, silicide layers 1602 are formed on the source/drain regions 114 and the gate region 404. Further, in some embodiments, an additional silicide layer (not shown) is formed on the first doped region 104a, the second doped region 104b, and/or the third doped region 104c. The silicide layers 1602 may, for example, be nickel silicide, titanium silicide, cobalt silicide, platinum silicide, tungsten silicide, or some other transition metal silicide.

In some embodiments, a process for forming the silicide layers 1602 comprises depositing a transition metal layer covering the structure of FIGS. 15A-15D, and subsequently heating the transition metal layer so it reacts with exposed silicon to form the silicide layers 1602. Further, in some embodiments, the process comprising removing unreacted material of the transition metal layer by an etch. The process may, for example, be a self-aligned process.

As illustrated by the views 1700A-1700D of FIGS. 17A-17D, an ILD layer 1702 is formed covering the structure of FIGS. 16A-16D. The ILD layer 1702 may, for example, be formed with a planar top surface, and/or may, for example, be formed of oxide, nitride, a low κ dielectric, some other dielectric, or a combination of the foregoing.

In some embodiments, a process for forming the ILD layer 1702 comprises depositing or growing the ILD layer 1702 covering the structure of FIGS. 16A-16D, and subsequently performing a planarization into the ILD layer 1702. The depositing or growing may, for example, be formed by chemical or physical vapor deposition, sputtering, some other deposition or growth process, or a combination of the foregoing. The planarization may, for example, be performed by chemical mechanical polishing (CMP).

Also illustrated by the views 1700A-1700D of FIGS. 17A-17D, contact vias 1704 are formed extending through the ILD layer 1702 to the source/drain regions 114 and/or the silicide layers 1602. The silicide layers 1602 facilitate ohmic contacts between the contact vias 1704 and the source/drain regions 114. Further, the contact vias 1704 are formed extending through the ILD layer 1702 to the first, second, and/or third doped region 104a, 104b, 104c and/or an additional silicide layer (not shown) on the first, second, and/or third doped region 104a, 104b, 104c.

In some embodiments, a process for forming the contact vias 1704 comprises performing an etch into the ILD layer 1702 to form contact-via openings corresponding to the contact vias 1704. The etch may be, for example, performed using photolithography. Further, in some embodiments, the process comprises filling the contact-via openings with a conductive material. The contact-via openings may, for example, be filled by depositing or growing a conductive layer covering the ILD layer 1702 and filling the contact-via openings, and subsequently performing a planarization into the ILD layer and the conductive layer. The planarization may, for example, be performed by CMP. The process may, for example, be part of a single damascene like process or a dual damascene like process.

While not shown, additional dielectric layers and conductive features may be subsequently formed on the ILD layer 1702. For example, one or more additional ILD layers, wires, inter-wire vias, and/or passivation layers may be formed on the ILD layer 1702.

Further, although FIGS. 8A-8D through 17A-17D illustrate a process for forming the embodiment depicted in FIG. 4A-4D, it is appreciated that a person of ordinary skill could implement the steps above (or substantially similar steps) to form the embodiments depicted in FIGS. 2A-2C, FIGS. 3A-3D, and FIGS. 5A-5D through 7A-7D.

Figure 18:
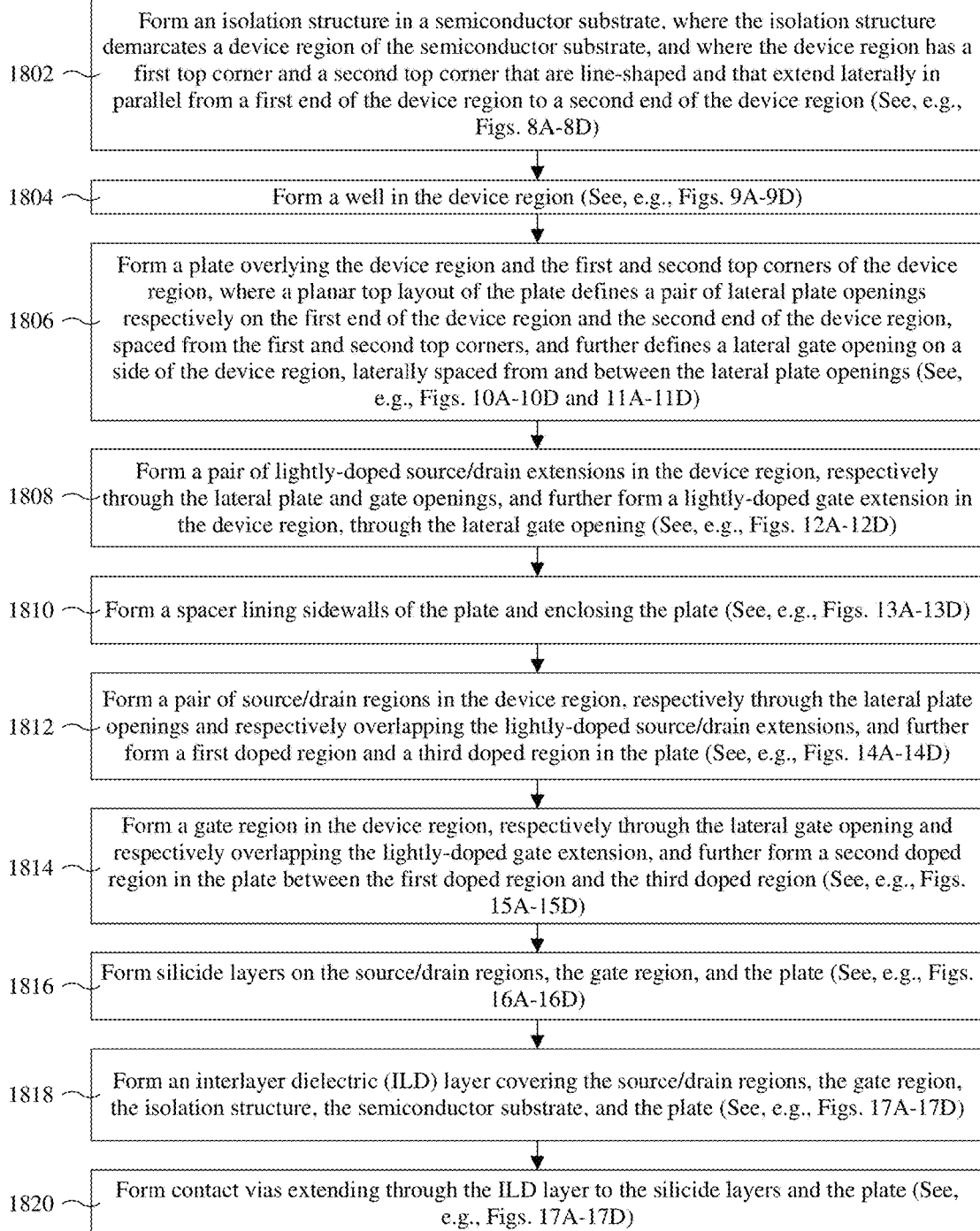
FIG. 18 illustrates a flowchart of some embodiments of the method of FIGS. 8A-8D through 17A-17D.

With reference to FIG. 18, a flowchart 1800 of some embodiments of the method for forming a FET with reduced flicker and random telegraph noise is provided. While the disclosed method and other methods illustrated and/or described herein may be illustrated and/or described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

At 1802, an isolation structure is formed in a semiconductor substrate. The isolation structure demarcates a device region of the semiconductor substrate. The device region has a first top corner and a second top corner that are line-shaped and that extend laterally in parallel from a first end of the device region to a second end of the device region. See, for example, FIGS. 8A-8D.

At 1804, in some embodiments, a well is formed in the device region. See, for example, FIGS. 9A-9D.

At 1806, a plate is formed overlying the device region and the first and second top corners of the device region, where a planar top layout of the plate defines a pair of lateral plate openings respectively on the first end of the device region and the second end of the device region, spaced from the first and second top corners, and further defines a lateral gate opening on a side of the device region, laterally spaced from and between the lateral plate openings. See, for example, FIGS. 10A-10D and 11A-11D.

At 1808, in some embodiments, a pair of lightly-doped source/drain extensions is formed in the device region, respectively through the lateral plate openings. Further, in some embodiments, a lightly-doped gate extension is formed in the device region, through the lateral gate opening. See, for example, FIGS. 12A-12D.

At 1810, a spacer is formed lining sidewalls of the plate and enclosing the plate. See, for example, FIGS. 13A-13D.

At 1812, a pair of source/drain regions is formed in the device region, respectively through the lateral plate openings and respectively overlapping the lightly-doped source/drain extensions. Further, a first doped region and a third doped region are formed in the plate. See, for example, FIGS. 14A-14D.

At 1814, a gate region is formed in the device region, respectively through the lateral gate opening and respectively overlapping the lightly-doped gate extension. Further, a second doped region is formed in the plate between the first doped region and the third doped region. See, for example, FIGS. 15A-15D.

At 1816, in some embodiments, silicide layers are formed on the source/drain regions, the gate region, and the plate. See, for example, FIGS. 16A-16D.

At 1818, an ILD layer is formed covering the source/drain regions, the gate region, the isolation structure, the semiconductor substrate, and the plate. See, for example, FIGS. 17A-17D.

At 1820, contact vias are formed extending through the ILD layer to the silicide layers and the plate. See, for example, FIGS. 17A-17D.

By spacing lateral plate openings from the first and second top corners, the source/drain regions and the lightly-doped source/drain extensions are also spaced from the first and second top corners. This, in turn, decreases source-drain current flowing along the first and second top corners, thereby reducing flicker and random telegraph noise. Further, by doping the plate, the work function of the plate can be manipulated to push source-drain current deep into the device region and away from a top surface of the device region. This may further reduce flicker and random telegraph noise by reducing current flow at the top surface, where there is a high concentration of defect states.

Thus, as can be appreciated from above, the present application relates to a plate design (and related method) to decrease flicker and random telegraph noise in semiconductor devices that is attributed to defects along STI corners and defects along the interface between the device region and the plate dielectric layer.

Accordingly, in some embodiments, the present application provides a semiconductor device. The semiconductor device includes a semiconductor substrate having a device region. An isolation structure extends laterally in a closed path to demarcate the device region. A first source/drain region and a second source/drain region are in the device region and laterally spaced. A sidewall of the first source/drain region directly contacts the isolation structure at a first isolation structure sidewall. The remaining sidewalls of the first source/drain region are spaced from the isolation structure. A selectively-conductive channel is in the device region and extends laterally from the first source/drain region to the second source/drain region. The semiconductor device further includes a plate having a central portion and a first peripheral portion. The central portion overlies the selectively-conductive channel, and the first peripheral portion protrudes from the central portion towards the first isolation structure sidewall.

In other embodiments, the present application provides a semiconductor device having a semiconductor substrate. A pair of source/drain regions is in the semiconductor substrate. The source/drain regions share a first doping type and are laterally spaced. A selectively-conductive channel is in the semiconductor substrate. The selectively-conductive channel extends laterally from one of the source/drain regions to another one of the source/drain regions. The semiconductor device further includes a polysilicon plate having a first doped region, a second doped region, and a third doped region. The second doped region overlies the selectively-conductive channel and is between the first doped region and the third doped region. The first and third doped regions respectively wrap around the source/drain regions and have the first doping type. The second doped region has a second doping type that is opposite the first doping type.

In yet other embodiments, the present application provides a method for manufacturing a semiconductor device. An isolation structure is formed in a semiconductor substrate. The isolation structure demarcates a device region of the semiconductor substrate. A plate is formed overlying the device region of the semiconductor substrate. The plate wraps around a first portion of the device region and a second portion of the device region. The first and second portions of the device region are on opposite sides of the device region and are separated by the plate. Further, the first and second portions of the device region each have a single sidewall adjoining the isolation structure. A first doping process is performed to implant first dopants into the device region of the semiconductor substrate. The first doping process is performed with the plate in place and forms a pair of source/drain regions, where the source/drain regions are respectively in the first portion of the device region and the second portion of the device region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device, the method comprising:
    forming an isolation structure in a semiconductor substrate, wherein inner sidewalls of the isolation structure demarcate a device region of the semiconductor substrate;
    forming a plate at least partially overlying the device region and at least partially overlying the isolation structure, wherein the plate exposes a first portion of the device region and a second portion of the device region that is laterally spaced from the first portion of the device region, wherein the first portion of the device region adjoins a first inner sidewall of the isolation structure and the second portion of the device region adjoins a second inner sidewall of the isolation structure, and wherein the plate at least partially overlies the first inner sidewall and the second inner sidewall; and
    with the plate at least partially overlying the device region, forming a first source/drain region in the first portion of the device region and a second source/drain region in the second portion of the device region.

2. The method of claim 1, further comprising:
    forming a plate dielectric layer at least partially overlying the device region and at least partially overlying the isolation structure, wherein the plate dielectric layer vertically separates the plate from the device region and the isolation structure, and wherein sidewalls of the plate dielectric layer are substantially aligned with sidewalls of the plate.

3. The method of claim 2, further comprising:
    forming a sidewall spacer over the semiconductor substrate and along the sidewalls of the plate and the sidewalls of the plate dielectric layer, wherein the sidewall spacer at least partially overlies the first inner sidewall and the second inner sidewall.

4. The method of claim 3, further comprising:
forming a first source/drain extension in the first portion of the device region and a second source/drain extension in the second portion of the device region, wherein the first source/drain extension and the second source/drain extension are formed before the sidewall spacer is formed, and wherein the first source/drain region and the second source/drain region are formed after the sidewall spacer is formed.

5. The method of claim 1, wherein forming the plate comprises:
forming a polysilicon layer covering the isolation structure and the device region; and
selectively removing portions of the polysilicon layer, thereby forming the plate.

6. The method of claim 5, further comprising:
forming a first doped region having a first doping type in the plate, wherein the first doped region is formed laterally between the first source/drain region and the second source/drain region.

7. The method of claim 6, further comprising:
forming a second doped region having a second doping type opposite the first doping type in the plate, wherein the second doped region is disposed on a first side of the first doped region, and wherein the first source/drain region and the second source/drain region have the second doping type.

8. The method of claim 7, further comprising:
forming a third doped region having the second doping type in the plate, wherein the third doped region is disposed on a second side of the first doped region opposite the first side of the first doped region.

9. A method for forming a semiconductor device, the method comprising:
forming an isolation structure in a semiconductor substrate, wherein inner sidewalls of the isolation structure demarcate a device region of the semiconductor substrate;
forming a plate at least partially overlying the device region and at least partially overlying the isolation structure, wherein the plate exposes a first portion of the device region and a second portion of the device region that is laterally spaced from the first portion of the device region, wherein the first portion of the device region adjoins a first inner sidewall of the isolation structure and the second portion of the device region adjoins a second inner sidewall of the isolation structure, wherein the first inner sidewall and the second inner sidewall are laterally spaced and face one another, and wherein the plate at least partially overlies the first inner sidewall and the second inner sidewall; and
with the plate at least partially overlying the device region, forming a first source/drain region in the first portion of the device region and a second source/drain region in the second portion of the device region.

10. The method of claim 9, further comprising:
forming an interlayer dielectric (ILD) layer covering the plate, the first source/drain region, and the second source/drain region.

11. The method of claim 9, wherein:
the plate at least partially overlies a third inner sidewall of the isolation structure and a fourth inner sidewall of the isolation structure; and the third inner sidewall and the fourth inner sidewall are laterally spaced and face one another.

12. The method of claim 11, wherein:
the first inner sidewall and the second inner sidewall are laterally spaced in a first direction; and
the third inner sidewall and the fourth inner sidewall are laterally spaced in a second direction perpendicular to the first direction.

13. The method of claim 12, wherein the plate continuously overlies the third inner sidewall from the first inner sidewall to the second inner sidewall.

14. The method of claim 13, wherein the plate continuously overlies the fourth inner sidewall from the first inner sidewall to the second inner sidewall.

15. The method of claim 11, wherein:
the first inner sidewall and the third inner sidewall meet at a first corner;
the first inner sidewall and the fourth inner sidewall meet at a second corner;
the second inner sidewall and the third inner sidewall meet at a third corner;
the second inner sidewall and the fourth inner sidewall meet at a fourth corner; and
the plate overlies the first corner, the second corner, the third corner, and the fourth corner.

16. The method of claim 15, wherein:
the first inner sidewall and the second inner sidewall extend in parallel from the third inner sidewall to the fourth inner sidewall; and
the third inner sidewall and the fourth inner sidewall extend in parallel from the first inner sidewall to the second inner sidewall.

17. A method for forming a semiconductor device, the method comprising:
forming an isolation structure in a semiconductor substrate, wherein inner sidewalls of the isolation structure demarcate a device region of the semiconductor substrate;
forming a plate at least partially overlying the device region and at least partially overlying the isolation structure, wherein the plate exposes a first portion of the device region and a second portion of the device region that is laterally spaced from the first portion of the device region, wherein the first portion of the device region adjoins a first inner sidewall of the isolation structure and the second portion of the device region adjoins a second inner sidewall of the isolation structure, and wherein the plate at least partially overlies the first inner sidewall and the second inner sidewall;
forming a sidewall spacer over the semiconductor substrate and along sidewalls of the plate, wherein the sidewall spacer extends laterally around the sidewalls of the plate in a closed loop path; and
with the plate at least partially overlying the device region, forming a first source/drain region in the first portion of the device region and a second source/drain region in the second portion of the device region, wherein the first source/drain region and the second source/drain region have a first doping type.

18. The method of claim 17, wherein forming the plate comprises:
forming a polysilicon layer covering the isolation structure and the device region;
forming a first masking layer over the polysilicon layer; and with the first masking layer in place over the polysilicon layer, removing unmasked portions of the polysilicon layer.

19. The method of claim 18, further comprising:

forming a second masking layer over the plate, the device region, and the isolation structure, wherein the second masking layer covers a first peripheral portion of the plate and a second peripheral portion of the plate; and with the second masking layer in place over the plate, forming a doped region in a central portion of the plate, wherein the doped region has a second doping type opposite the first doping type.

20. The method of claim 19, further comprising:

forming a third masking layer over the plate, the device region, and the isolation structure, wherein the third masking layer covers the central portion of the plate, and wherein the first source/drain region and the second source/drain region are formed with the third masking layer in place over the plate.

* * * * *